(12) United States Patent
Usami

(10) Patent No.: US 10,256,135 B2
(45) Date of Patent: Apr. 9, 2019

(54) SEMICONDUCTOR DEVICE AND METHOD OF MANUFACTURING SEMICONDUCTOR DEVICE

(71) Applicant: RENESAS ELECTRONICS CORPORATION, Tokyo (JP)

(72) Inventor: Tatsuya Usami, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/786,366

(22) Filed: Oct. 17, 2017

(65) Prior Publication Data

US 2018/0130900 A1 May 10, 2018

(30) Foreign Application Priority Data

Nov. 10, 2016 (JP) ................................. 2016-219836

(51) Int. Cl.
| | |
|---|---|
| H01L 21/76 | (2006.01) |
| H01L 21/768 | (2006.01) |
| H01L 21/762 | (2006.01) |
| H01L 21/764 | (2006.01) |
| H01L 21/8234 | (2006.01) |
| H01L 21/8238 | (2006.01) |
| H01L 27/092 | (2006.01) |
| H01L 21/74 | (2006.01) |
| H01L 29/06 | (2006.01) |
| H01L 21/285 | (2006.01) |

(52) U.S. Cl.
CPC .......... *H01L 21/762* (2013.01); *H01L 21/743* (2013.01); *H01L 21/764* (2013.01); *H01L 21/8234* (2013.01); *H01L 21/823871* (2013.01); *H01L 27/092* (2013.01); *H01L 21/28518* (2013.01); *H01L 21/823878* (2013.01); *H01L 21/823892* (2013.01); *H01L 29/0649* (2013.01)

(58) Field of Classification Search
CPC .......... H01L 21/743; H01L 21/762–21/76297; H01L 21/764; H01L 21/8234; H01L 21/823871; H01L 21/28518; H01L 21/823878; H01L 21/823892; H01L 29/0649
See application file for complete search history.

(56) References Cited

U.S. PATENT DOCUMENTS

| | | | |
|---|---|---|---|
| 9,397,180 B1 * | 7/2016 | Yang | ................. H01L 29/41708 |
| 2004/0094838 A1 * | 5/2004 | Seo | ................... H01L 21/28556 |
| | | | 257/750 |

(Continued)

FOREIGN PATENT DOCUMENTS

JP 2013-222838 A 10/2013

*Primary Examiner* — Eric A. Ward
(74) *Attorney, Agent, or Firm* — McDermott Will & Emery LLP

(57) ABSTRACT

To provide a semiconductor device having a substrate contact in a deep trench thereof and having an improved characteristic. A PVD-metal film (metal film formed by PVD) is used as a first barrier metal film which is a lowermost layer barrier metal film formed in a deep trench penetrating an n type epitaxial layer and a reaching a layer therebelow. Such a configuration makes it possible to stably form a metal silicide layer at a boundary between the PVD-metal film and a silicon layer therebelow (or silicon substrate) and thereby stabilize the contact resistance.

7 Claims, 26 Drawing Sheets

(56) References Cited

U.S. PATENT DOCUMENTS

2011/0175205 A1* 7/2011 Morii ............... H01L 21/76232
　　　　　　　　　　　　　　　　　　　　　　257/618
2015/0041960 A1* 2/2015 Morii ................ H01L 29/7833
　　　　　　　　　　　　　　　　　　　　　　257/621

* cited by examiner

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2016-219836 filed on Nov. 10, 2016 including the specification, drawings, and abstract is incorporated herein by reference in its entirety.

BACKGROUND

The present invention relates to a semiconductor device and a method of manufacturing a semiconductor device. Particularly, it is suited for use in a semiconductor device having, in a deep trench thereof, a substrate contact.

A MOS (metal oxide semiconductor) transistor is sometimes formed on a semiconductor substrate having an epitaxial layer (epi substrate) or a SOI (silicon on insulator) substrate.

For example, Japanese Unexamined Patent Application Publication No. 2013-222838 (Patent Document 1) discloses a semiconductor device having a high breakdown voltage MOS transistor and a CMOS transistor. An element formation region in which the high breakdown voltage MOS transistor and the CMOS transistor are to be formed is surrounded by an isolation formed in a deep trench (deep trench isolation).

PATENT DOCUMENTS

[Patent Document 1] Japanese Unexamined Patent Application Publication No. 2013-222838

SUMMARY

The present inventors are engaged in the research and development of semiconductor devices having both a high breakdown voltage MOS or bipolar element and a low breakdown voltage MOS transistor on a semiconductor substrate having an epitaxial layer (epi substrate). They have carried out extensive investigation with a view to improving the characteristic of such a semiconductor device.

In such a case, element regions are electrically isolated from each other by being surrounded by an isolation formed in a deep trench (DTI). In a semiconductor device having such an isolation (DTI) formed in a deep trench, it is inevitably necessary to provide a trench reaching a substrate located at a deep position and provide a power feed plug (substrate contact) inside the trench when power is fed to the substrate from the surface side thereof (element formation side). It is however difficult to stabilize the coupling resistance of the substrate contact formed in the deep trench. There is accordingly a demand for the investigation of the configuration and manufacturing method of a substrate contact having a good coupling resistance.

Another problem and a novel feature of the invention will be apparent from the description herein and accompanying drawings.

The configuration of typical embodiments disclosed herein will hereinafter be outlined briefly.

A semiconductor device described in a typical embodiment disclosed herein has a first coupling portion comprised of a first conductor in a deep trench reaching a substrate and a second coupling portion comprised of a second conductor in a fine hole reaching the component of an element. The first conductor and the second conductor have, at the lowermost layer thereof, a metal film formed by physical vapor deposition.

A method of manufacturing a semiconductor device described in a typical embodiment disclosed herein has a step of forming a metal film in a deep trench reaching a substrate and in a fine hole reaching the component of an element by physical vapor deposition.

The semiconductor device according to the typical embodiment disclosed herein can have an improved characteristic.

The method of manufacturing a semiconductor device according to the typical embodiment disclosed herein can provide a semiconductor device having a good characteristic.

DETAILED DESCRIPTION

In the below-described embodiments, a description will be made after divided into a plurality of sections or embodiments if necessary for the sake of convenience. These sections or embodiments are not independent from each other unless otherwise particularly specified, but one of them may be a modification example, an application example, a detailed description, a complementary description, or the like of a part or whole of the other one. In the below-described embodiments, when a reference is made to the number (including the number, value, amount, range, or the like) of a component, the number is not limited to a specific number but may be more or less than the specific number, unless otherwise particularly specified or principally apparent that the number is limited to the specific number.

Further, in the below-described embodiments, the constituent component (including component step or the like) is not always essential unless otherwise particularly specified or principally apparent that it is essential. Similarly, in the below-described embodiments, when a reference is made to the shape, positional relationship, or the like of the constituent component, a component substantially approximate or analogous in shape or the like is also embraced unless otherwise particularly specified or principally apparent that it is not. This also applies to the above-described number (including the number, value, amount, range, or the like).

Embodiments of the invention will hereinafter be described in detail based on some drawings. In all the drawings for describing the embodiments, members having the same function will be identified by the same or like sign and overlapping descriptions will be omitted. When a plurality of similar members (sites) is present, they are sometimes indicated by both a generic sign and an additional sign for showing an individual or specific site. In the below-described embodiments, a description on the same or similar portion is not repeated in principle unless otherwise particularly necessary.

Even from cross-sectional views used in the below-described embodiments, hatching may be omitted to facilitate viewing of them. Even plan views, on the other hand, may be hatched to facilitate viewing of them.

In the cross-sectional and plan views, the dimension of each site does not always correspond to that of an actual device and a specific site may be enlarged relatively to facilitate understanding of the drawings. Even in a plan view and a cross-sectional view which are made to correspond to each other, a specific site may be enlarged to facilitate viewing of it.

First Embodiment

The structure of a semiconductor device of the present embodiment will hereinafter be described referring to some drawings.

[Structure]

Figure 4:
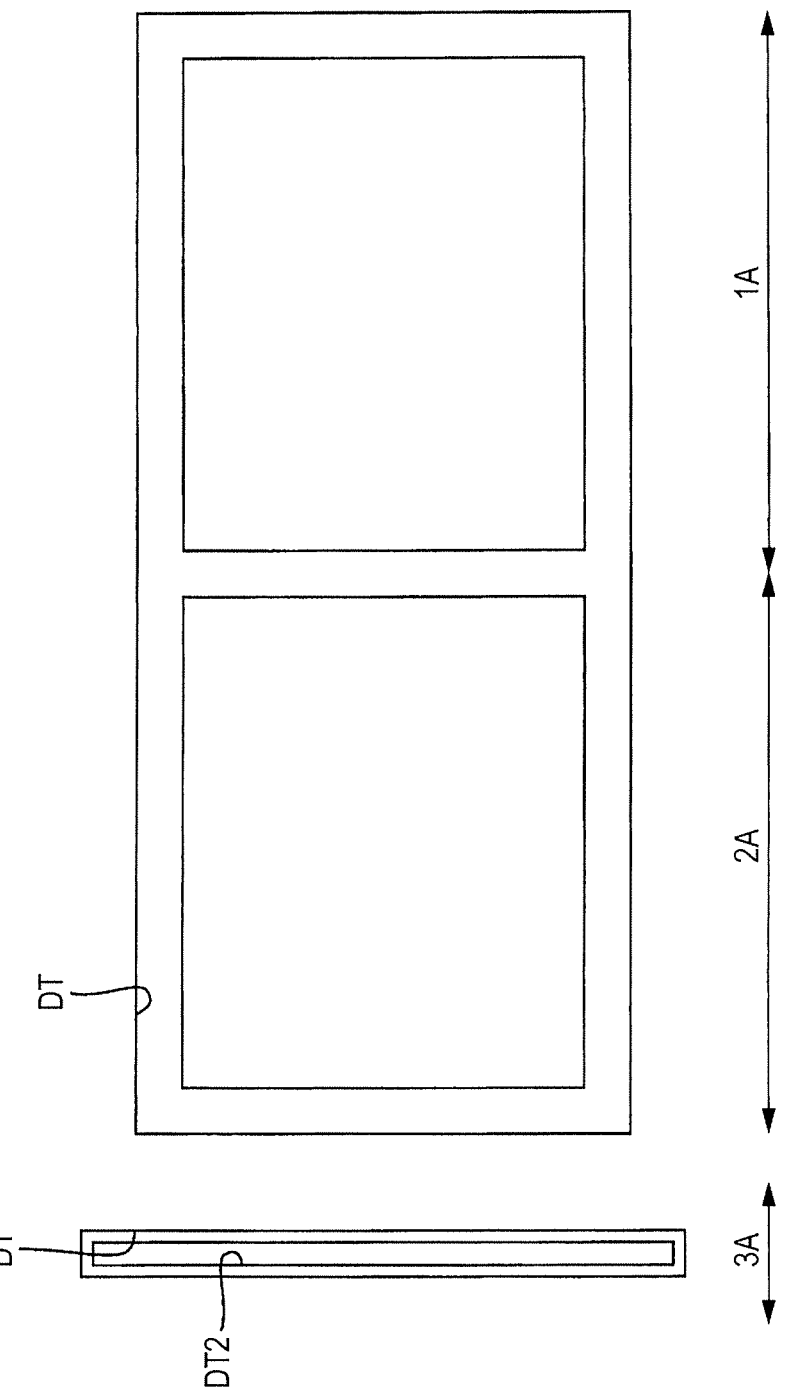
FIG. 4 is a plan view showing the configuration of the semiconductor device of First Embodiment.

FIGS. 1 to 5 include a cross-sectional view and a plan view showing the configuration of a semiconductor device of the present embodiment. FIGS. 1 to 3 and FIG. 5 are cross-sectional views and FIG. 4 is a plan view.

Figure 1:
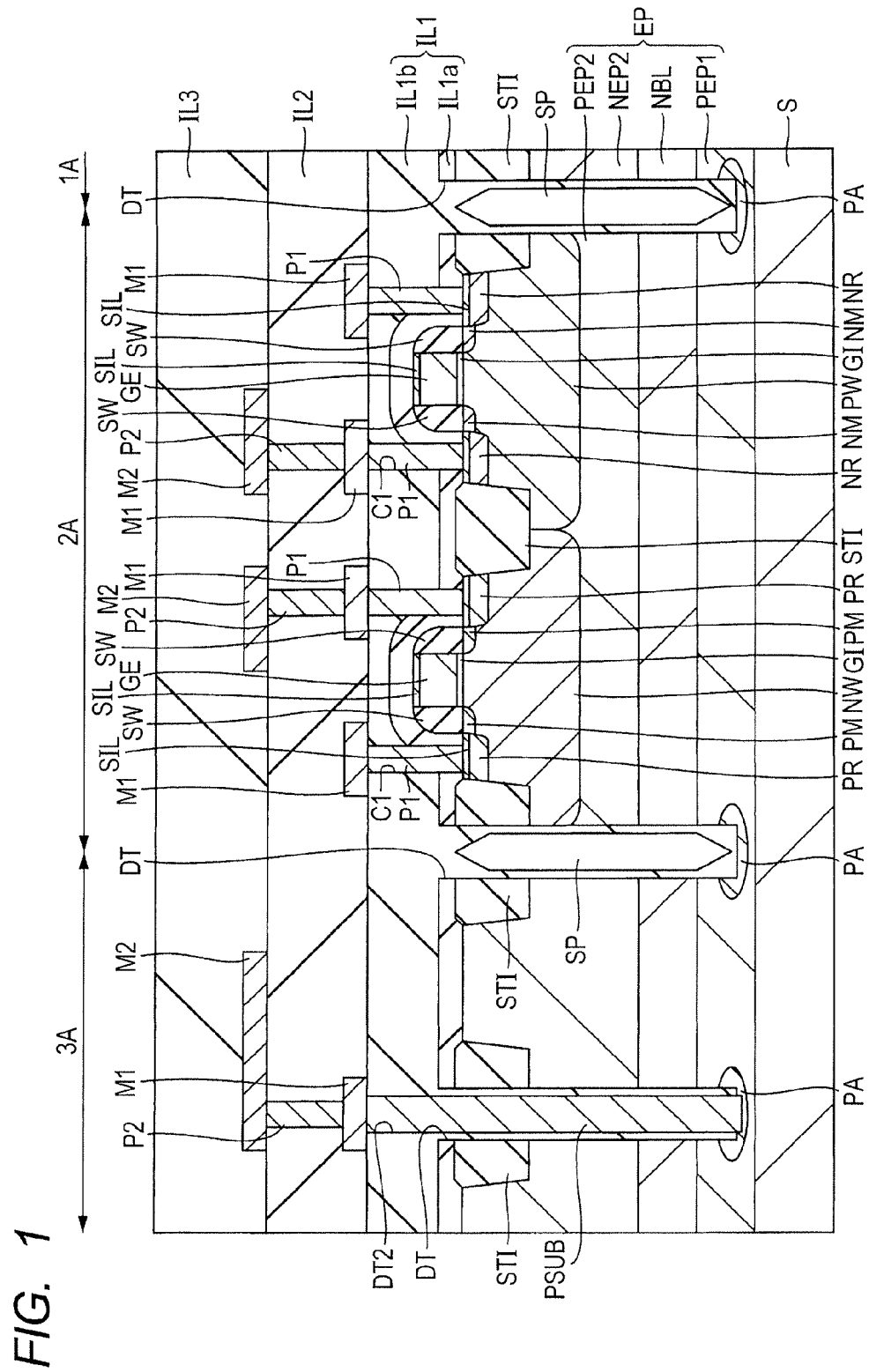
FIG. 1 is a cross-sectional view showing the configuration of a semiconductor device of First Embodiment.
Figure 5:
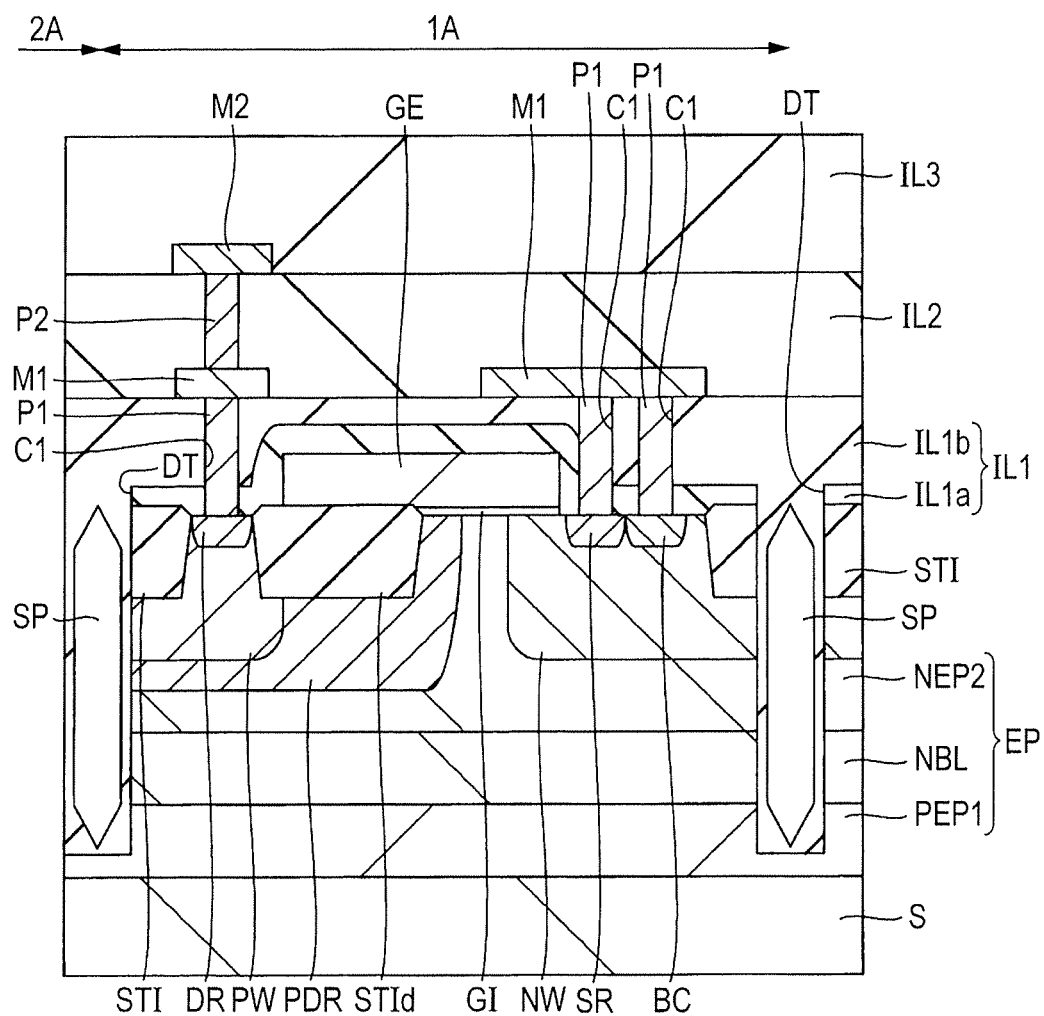
FIG. 5 is a cross-sectional view showing the configuration of the semiconductor device of First Embodiment.

As shown in FIGS. 1 and 5, the semiconductor device of the present embodiment has, as some regions of a semiconductor substrate (substrate), a power feed region 3A, a second element formation region 2A, and a first element formation region 1A. The semiconductor substrate is comprised of a support substrate S having thereon an epitaxial layer EP. The support substrate S is made of, for example, p type single crystal silicon having a specific resistance of from about 1 to 10 Ωcm. This semiconductor substrate is a substantially disk-shaped semiconductor wafer having the epitaxial layer EP on the entire surface of the p type single crystal silicon substrate (S).

Figure 8:
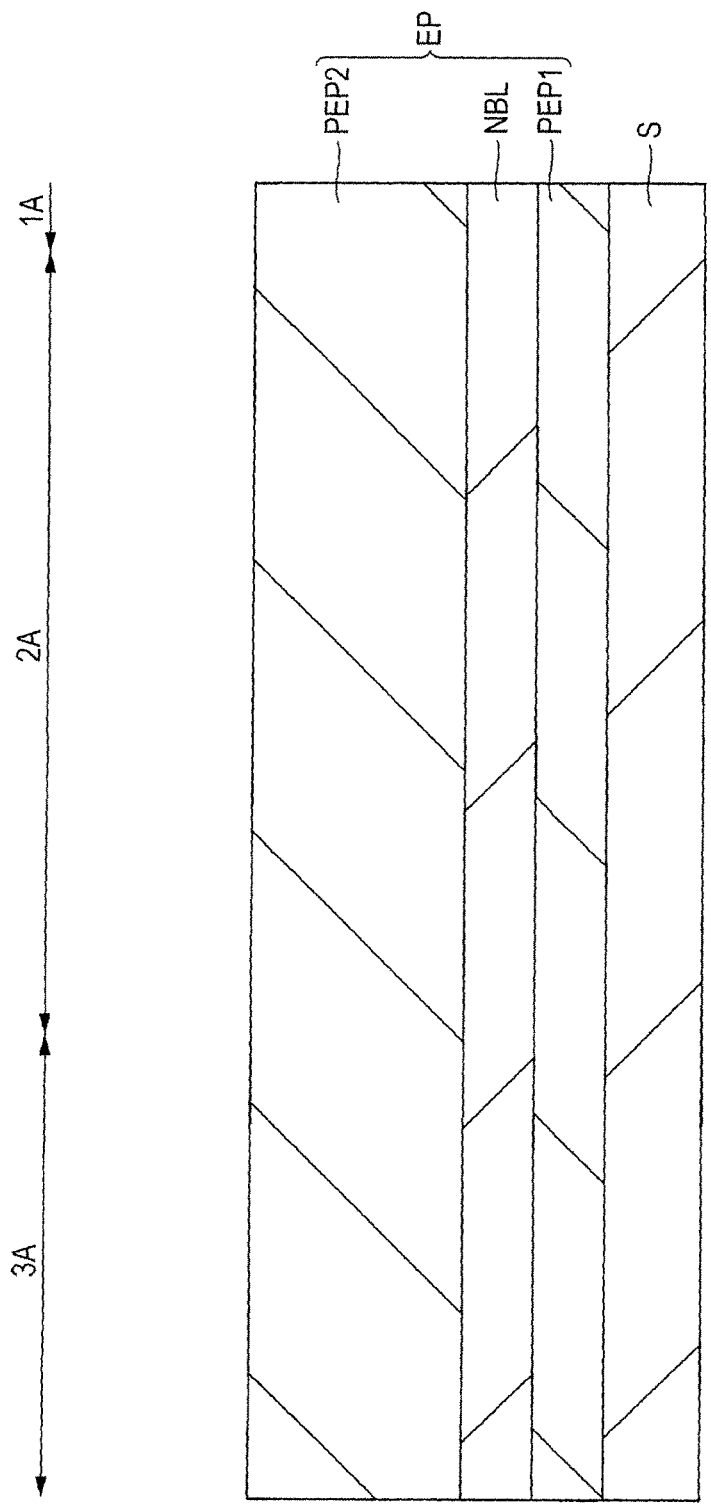
FIG. 8 is a cross-sectional view showing a step of manufacturing the semiconductor device of First Embodiment.

The epitaxial layer EP here has a p$^-$ type epitaxial layer PEP1 formed on the p type single crystal silicon substrate (S), an n type epitaxial film (which may also be called "n type buried diffusion layer", "n type buried region", or "n type semiconductor region") NBL formed thereon, and a p$^-$ type epitaxial layer PEP2 formed thereon (refer to FIG. 8). The p$^-$ type epitaxial layer PEP2 in the first element formation region 1A is however converted into an n type one by the introduction of an n type impurity. This region converted into an n type one is called an n$^-$ type epitaxial layer (which may also be called "deep n type well") NEP2 (refer to FIG. 11).

The semiconductor substrate (S, EP) has, in the first element formation region 1A thereof, a LDMOS transistor (laterally diffused metal-oxide-semiconductor field effect transistor) (FIG. 5). More specifically, the semiconductor substrate has, on the main surface of the n$^-$ type epitaxial layer NEP2 thereof, a LDMOS transistor. The LDMOS transistor is sometimes called "lateral power MOSFET". Here, a p channel type LDMOS transistor is shown by way of example.

The LDMOS transistor has therebelow an n type epitaxial film NBL. It can keep a high breakdown voltage, being isolated from another region by this n type epitaxial film NBL and a deep trench (which may also be called "deep trench isolation (DTI)") DI.

This LDMOS transistor has a gate electrode GE formed above the semiconductor substrate (n$^-$ type epitaxial layer NEP2) via a gate insulating film GI and a source region SR and a drain region DR formed on the respective sides (right and left directions on the page in FIG. 5) of the gate electrode GE.

A semiconductor region ((NEP2, NW) between the source region (p$^+$ type semiconductor region, p$^+$ type impurity region, or p$^+$ type diffusion region) SR and the drain region (p$^+$ type semiconductor region, p$^+$ type impurity region, or p$^+$ type diffusion region) DR becomes a channel formation region. An electric field at the end portion of the gate electrode GE on the side of the drain region DR can be relaxed by providing a p type drift region PDR and a drain insulation region (field drain region) STId between the channel formation region and the drain region DR (field plate effect). The LDMOS thus obtained can therefore have a high breakdown voltage.

The configuration of the LDMOS transistor will hereinafter be described more specifically. The source region SR is in an n type well region (n type semiconductor region) NW. A region in which the n type well region NW, the p-type epitaxial layer NEP2, and the gate electrode GE overlap with one another becomes a channel formation region. The drain region DR is in a p type well region (p type semiconductor region) PW. This p type well region PW has an impurity concentration lower than that of the drain region DR. The p type well region PW is in a p type drift region (p type semiconductor region) PDR. This p type drift region PDR has an impurity concentration lower than that of the p type well region PW. These p type drift region PDR and p type well region PW have therein the drain insulation region STId. The n type well region NW has therein an $n^+$ type body contact region (back gate region) BC adjacent to the source region SR.

The gate electrode GE extends, via the gate insulating film GI, from above the channel formation region to above the drain insulation region STId.

The LDMOS transistor, the semiconductor regions (NW, PDR, PW, SR, DR, and BC), the gate electrode GE, and the like are formed in a region (active region) surrounded by an insulation region STI. The insulation region STI is made of an insulating film with which a trench in the semiconductor substrate (epitaxial layer EP) is filled. The insulation region STI has therein a deep trench DT penetrating the insulation region STI. The deep trench DT is filled with an insulating film. The insulating film may have, inside thereof, a space (which may also be called "gap" or "air gap") SP. The LDMOS transistor is formed in such a region (active region) surrounded by the deep trench DT (FIG. 4).

The insulation region STI has a depth of, for example, about 0.3 μm. The deep trench DT has a depth of, for example, about 10 μm. The deep trench DT has a width of from about 0.3 to 1 μm.

The source region SR and the $n^+$ type body contact region BC have thereon a plug (source plug) P1 and the drain region DR has thereon a plug (drain plug) P1. Although not shown in the cross-section of FIG. 5, the gate electrode GE has thereon a plug (gate plug) P1. These plugs P1 are in a contact hole (fine hole) C1 formed in an interlayer insulating film IL1.

The semiconductor substrate has a MOS transistor in the second element formation region 2A (FIG. 1). More specifically, the semiconductor substrate has a MOS transistor on the main surface of the $p^-$ type epitaxial layer PEP2. The transistor shown as an example here is a CMOS (complementary metal oxide semiconductor). As shown in FIG. 1, the semiconductor substrate has an n type MOS transistor (which may also be called "n channel type MOSFET") and a p type MOS transistor (which may also be called "p channel type MOSFET") on the main surface of the $p^-$ type epitaxial layer PEP2.

The n type MOS transistor is on the main surface of the p type well region PW provided in the $p^-$ type epitaxial layer PEP2 of the semiconductor substrate. More specifically, the n type MOS transistor has the gate electrode GE formed on the p type well region PW via the gate insulating film GI and source and drain regions formed in the semiconductor substrate (p type well region PW) S on the respective sides of the gate electrode. These source and drain regions are each comprised of a lightly doped n type semiconductor region NM and a heavily doped n type semiconductor region NR. Such a structure is called "LDD structure". The gate electrode GE has, on both sides thereof, a sidewall insulating film SW. The lightly doped n type semiconductor region NM is formed in self alignment with the side surface of the gate electrode GE, while the heavily doped n type semiconductor region NR is formed in self alignment with the side surface of the sidewall insulating film SW.

The p type MOS transistor is on the main surface of the n type well region provided in the $p^-$ type epitaxial layer PEP2 of the semiconductor substrate. More specifically, the p type MOS transistor has a gate electrode GE formed on the n type well region NW via the gate insulating film GI and source and drain regions formed in the semiconductor substrate (n type well region NW) on the respective sides of the gate electrode. These source and drain regions are each comprised of a lightly doped p type semiconductor region PM and a heavily doped p type semiconductor region PR. Such a structure is called "LDD structure". The gate electrode GE has, on both sides thereof, a sidewall insulating film SW. The lightly doped p type semiconductor region PM is formed in self alignment with the side surface of the gate electrode GE, while the heavily doped p type semiconductor region PR is formed in self alignment with the side surface of the sidewall insulating film SW.

The heavily doped n type semiconductor region NR, the heavily doped p type semiconductor region PR, the gate electrode GE of the n type MOS transistor, and the gate electrode GE of the p type MOS transistor have thereon a metal silicide layer (metal silicide film) SIL formed by the salicide (self aligned silicide) technology. The metal silicide layer SIL is made of, for example, a cobalt silicide layer.

The n type MOS transistor and the p type MOS transistor are formed in a region (active region) surrounded by the insulation region STI. The insulation region STI has therein a deep trench DT penetrating the insulation region STI. The deep trench DT is filled with an insulating film. Thus, in a region (active region) surrounded by the deep trench DT, a CMOS transistor is formed (FIG. 4). The insulation region STI also lies between the n type MOS transistor and the p type MOS transistor.

The heavily doped n type semiconductor region NR (metal silicide layer SIL) or heavily doped p type semiconductor region PR (metal silicide layer SIL) has thereon a plug P1. Although not shown in the cross-section of FIG. 1, the gate electrode GE has thereon a plug P1. These plugs P1 are each in a contact hole C1 formed in the interlayer insulating film IL1.

The power feed region 3A of the semiconductor substrate (S, EP) has therein a plug (substrate contact) PSUB penetrating the n type epitaxial film NBL and reaching the $p^-$ type epitaxial layer PEP1 therebelow. The $p^-$ type epitaxial layer PEP1 has the same conductivity type with that of the support substrate S and power is fed to the support substrate S via the plug PSUB. For example, the support substrate S is fixed to a ground potential via the plug PSUB. The plug PSUB is made of a conductive film with which a deep trench DT2 is filled. The deep trench DT2 is inside the deep trench DT. The deep trench DT2 has an aspect ratio of 15 or more. The deep trench DT2 has an opening width of 0.8 μm or less and has a depth of 12 μm or more. The deep trench DT2 has a substantially rectangular plane shape (linear plane shape) (refer to FIG. 4) or has a portion having a substantially rectangular (linear) plane shape. For example, the plane shape of the deep trench DT2 has a length 10 times or more of the opening width.

Figure 2:
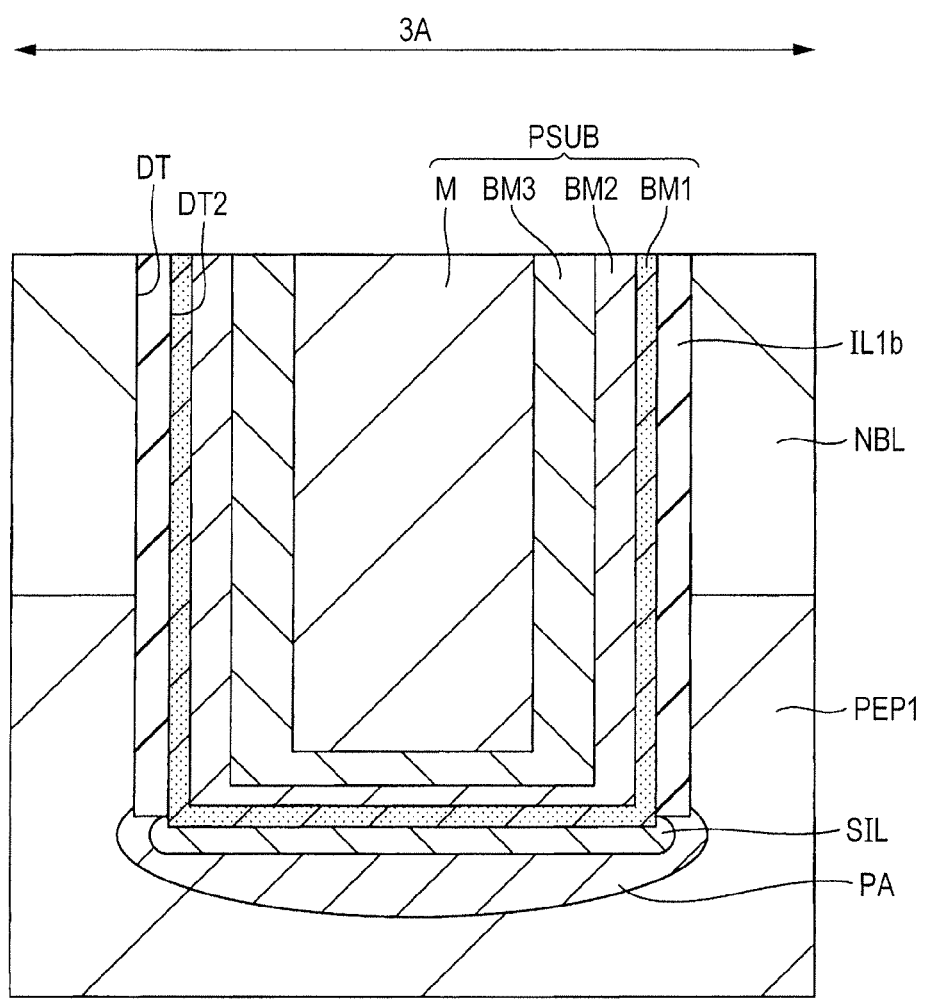
FIG. 2 is a cross-sectional view showing the configuration of the semiconductor device of First Embodiment.
Figure 3:
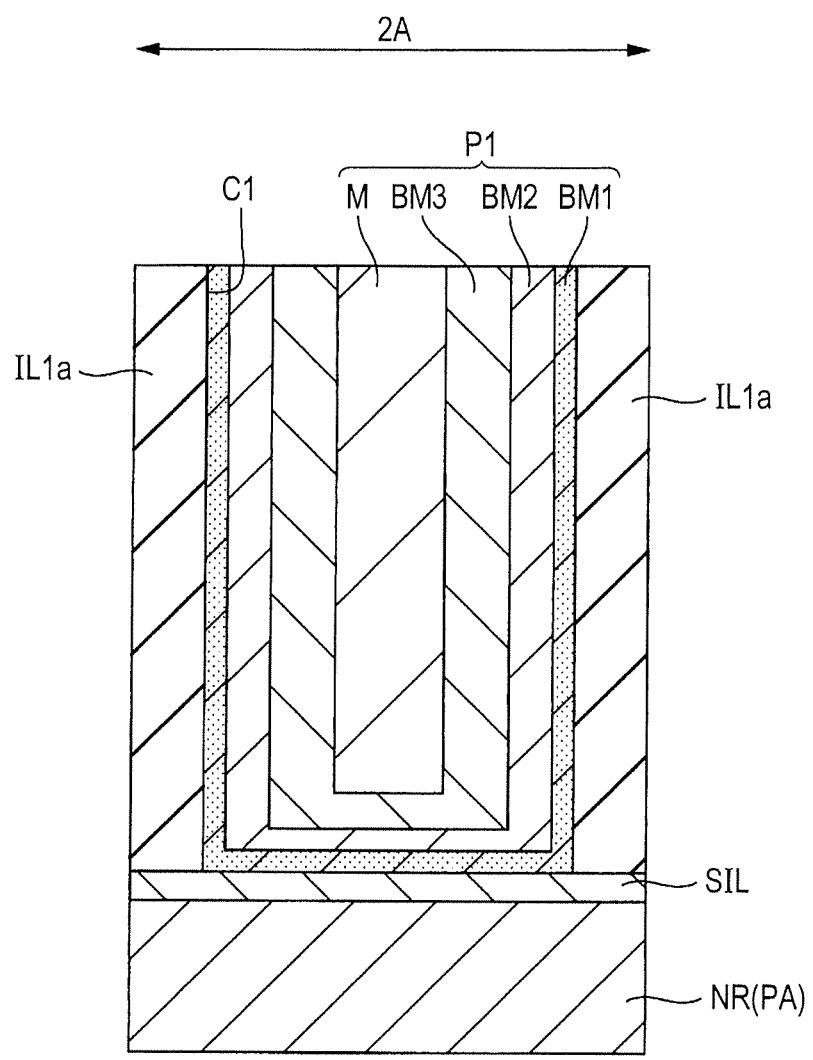
FIG. 3 is a cross-sectional view showing the configuration of the semiconductor device of First Embodiment.

The plug PSUB described herein is comprised of a stacked film of a PVD-Ti film, a CVD-Ti film, a CVD-TiN film, and a CVD-W film obtained by filling the deep trench DT2 therewith (refer to FIG. 2). The thicknesses of the PVD-Ti film, the CVD-Ti film, and the CVD-TiN film are, for example, 5 nm, 10 nm, and from 5 to 10 nm, respectively. The CVD-W film is thick enough to fill the deep trench DT2 therewith.

The term "PVD-metal film" means a metal film formed by PVD (physical vapor deposition). The term "CVD-metal film" means a metal film formed by CVD (chemical vapor deposition). The stacked film of the PVD-Ti film, the CVD-Ti film, the CVD-TiN film, and the CVD-W film is therefore a stacked film of a PVD-(first metal) film, a CVD-(first metal) film, a CVD-(nitride of a first metal) film (compound film of a first metal), and a CVD-(second metal) film.

The deep trench DT2 has, at the bottom thereof, a p type impurity region PA. The PVD-Ti film and the p type impurity region PA have, at the boundary therebetween, a $TiSi_X$ (titanium silicide) film.

Of the PVD-Ti film, the CVD-Ti film, the CVD-TiN film, and the CVD-W film configuring the stacked film, the PVD-Ti film, the CVD-Ti film, and the CVD-TiN film are conductive films configuring a barrier metal. The CVD-W film is a conductive film mainly configuring the plug (also called "main conductor film"). The barrier metal is used for preventing diffusion of the metal configuring the main conductor film or preventing a mutual reaction of a constituent material (Si in this case) of the lower layer of the plug with the main conductor film.

The plug P1 is made of a conductive film with which the contact hole C1 is filled. The contact hole C1 has an aspect ratio smaller than that of the deep trench DT2. The contact hole C1 has an opening width smaller than that of the deep trench DT2. The contact hole C1 has a depth smaller than that of the deep trench. The contact hole C1 has an aspect ratio of, for example, 7 or less. The contact hole C1 has an opening width of 0.15 μm or less. The contact hole C1 has a depth of 0.8 μm or less. The contact hole C1 has a substantially round (including oblong) plane shape. For example, the contact hole C1 has, in the planar shape thereof, a long diameter 3 times or less of the opening width (short diameter).

This plug P1 can be formed by the same steps as those for the formation of the plug PSUB. In this case, the plug P1 is comprised of a stacked film of a PVD-Ti film, a CVD-Ti film, a CVD-TiN film, and a CVD-W film with which the contact hole C1 is filled. The contact hole C1 has, at the bottom thereof, the metal silicide layer SIL.

Thus, the PVD-metal film (metal film formed by PVD) is used as the first barrier metal film BM1 which is the lower-most layer and configures the plug PSUB formed in the deep trench DT2 penetrating the n type epitaxial film NBL and reaching the layer therebelow. This contributes to stable formation of the metal silicide layer SIL at the boundary between the PVD-metal film and a silicon layer therebelow (or silicon substrate) and stabilization of contact resistance.

Steps of forming the plug PSUB will hereinafter be described referring to FIGS. 6A to 6F. FIGS. 6A to 6F are cross-sectional views showing the steps of forming the plug of the present embodiment. The plug P1 is formed by the same steps, but they will be described referring to the cross-sectional view of the plug PSUB.

Figure 6A:
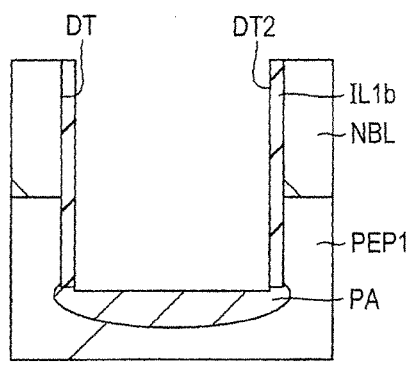
FIGS. 6A, 6B, 6C, 6D, 6E, and 6F are cross-sectional views showing steps of forming a plug of First Embodiment.

As shown in FIG. 6A, a deep trench DT2 penetrating the n type epitaxial film NBL and reaching the p⁻ type epitaxial layer PEP1 therebelow is formed. On the side wall of the deep trench DT2, the interlayer insulating film IL1b remains. From the bottom surface of the deep trench DT2, the p type impurity region PA is exposed.

Figure 6D:
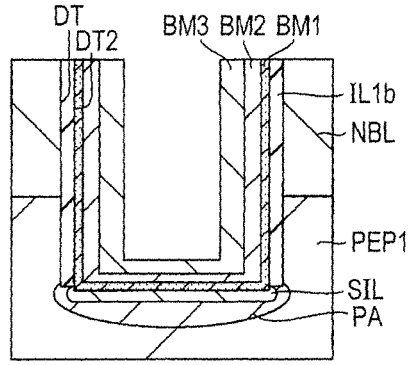
Figure 6B:
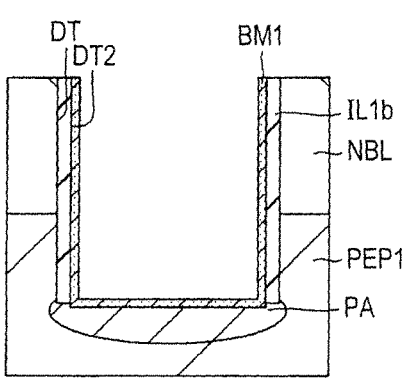

Next, as shown in FIG. 6B, a thin Ti film is formed as the first barrier metal film BM1 by sputtering which is a kind of PVD. The resulting PVD-Ti film has a thickness of, for example, about 5 nm.

For example, a target made of Ti is irradiated with an Ar atom or the like and a rebounded Ti component is deposited on the semiconductor substrate. The processing is performed in an Ar atmosphere. The processing temperature is, for example, from about 200 to 300° C. Examples of sputtering include long throw sputtering, collimate sputtering, DC magnetron sputtering, ionized plasma sputtering, and self ionized plasma sputtering. As will be described later, sputtering with high directivity is preferred.

Figure 25:
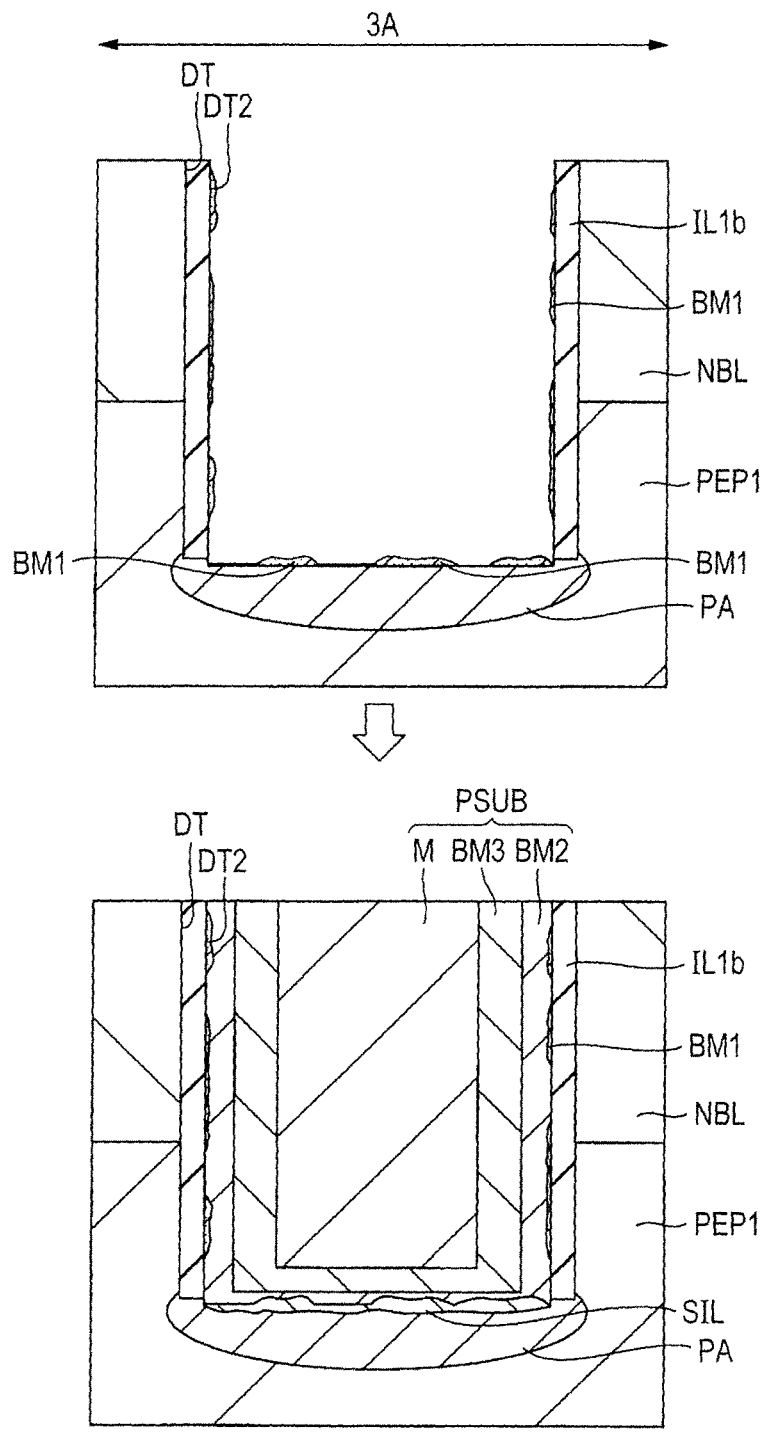
FIG. 25 is a cross-sectional view showing another configuration of the semiconductor device of First Embodiment.

The PVD-Ti film (BM1) shown in FIG. 6B is continuous with uniform thickness on the bottom surface and the side wall of the deep trench DT2, but this PVD-Ti film is required to be present at least on the bottom surface of the deep trench DT2 and it does not necessarily be formed on the side wall. In other words, this PVD-Ti film may be formed on the bottom surface of the deep trench DT2 in preference to the side wall thereof. This PVD-Ti film is not necessarily formed on the entire bottom surface of the deep trench DT2 and it may be formed on a portion of the bottom surface (refer to FIG. 25). FIG. 25 is a cross-sectional view showing another configuration of the semiconductor device of the present embodiment. Thus, the PVD-Ti film will be a raw material film for silicidation which will be described later so that it may be formed at least on the bottom surface of the deep trench DT2 and further, it may be formed on a portion of the bottom surface. For example, the PVD-Ti film (BM1) has a maximum thickness of 10 nm or less, more preferably 5 nm or less on the bottom surface of the deep trench DT2.

In particular, PVD is a method having high directivity so that when it is used, a film is formed more easily on the bottom surface of a trench than on the side wall thereof. Further, when the trench has a high aspect ratio, due to blocking with an eaves-like deposited film, a film is formed more easily on the bottom surface than on the side surface. The film growth on the bottom surface may be accelerated by applying a bias to the substrate or a method using a collimator (the above-described collimate sputtering). Still further, when the PVD-Ti film is formed in the contact hole C1 simultaneously with formation of the deep trench DT2, it is preferred to use a PVD-metal film to be formed on the bottom surface in preference to the side wall because the fine opening portion of the contact hole C1 becomes easily blocked with the above-described eaves-like deposited film. Thus, by forming the PVD-metal film as the lowermost layer film of the barrier metal, the metal silicide layer SIL can be formed stably and at the same time, the fine contact hole C1 can be filled smoothly without being blocked. The function of the barrier metal can be maintained by a CVD-TiN film or CVD-Ti film having a good coverage property which will be described later.

As described above, when the deep trench DT2 formed has a substantially rectangular shape (linear shape), the deep trench DT2 extends also in the depth direction of this page showing FIG. 6B (refer to FIG. 4) so that even if the formation area of the PVD-Ti film is small in one cross-section (refer to FIG. 25), the PVD-Ti film is also formed in the depth direction. The PVD-Ti film having a relatively large area can therefore be secured as a raw material for silicidation.

Figure 6E:
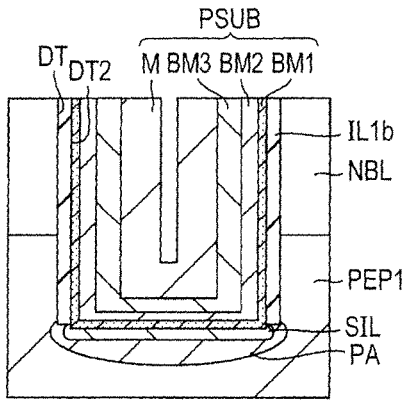
Figure 6C:
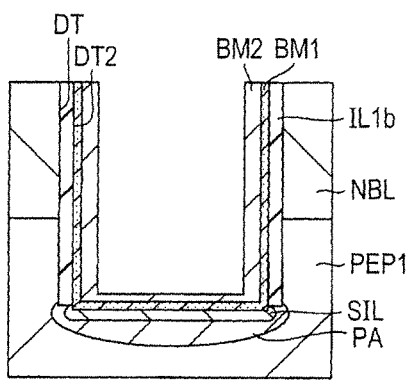

Next, as shown in FIGS. 6C and 6D, a Ti film is formed as a second barrier metal film BM2 on the first barrier metal BM1 by CVD and then a TiN film is formed as a third barrier metal film BM3 by CVD. This CVD-Ti film has a thickness of, for example, about 10 nm and the CVD-TiN film has a thickness of, for example, about 10 nm. These films can be formed continuously by changing a raw material gas. For example, after formation of a CVD-Ti film by using a $TiCl_4$ gas which is a Ti compound gas, $N_2$ is added and by using the resulting gas mixture of $TiCl_4$ and $N_2$, a CVD-TiN film is formed. This stacked film of the CVD-Ti film and the CVD-TiN film is formed continuously on the bottom surface and side wall of the deep trench DT2 with a more uniform thickness than the PVD-Ti film. The function as a barrier metal can therefore be ensured by the stacked film (CVD-TiN film/CVD-Ti film) having a good coverage property.

The growth temperature of the CVD-Ti and CVD-TiN which are the second barrier metal film BM2 and the third barrier metal film BM3, respectively, are from about 600 to 700° C. At a contact portion between the PVD-Ti film and the p type impurity region PA, therefore, a silicidation reaction occurs. As a result, a metal silicide layer ($TiSi_X$ film, here) which is a compound film between the metal and the substrate (Si) is formed at the bottom portion of the deep trench DT2. This silicidation reaction can be accelerated by providing the p type impurity region PA at the bottom portion of the deep trench DT2 and thereby converting the silicon layer at the bottom portion of the deep trench DT2 into a p type one. By this silicidation reaction, the PVD-Ti film at the bottom portion of the deep trench DT2 may be converted completely into the metal silicide SIL or an unreacted PVD-Ti film may remain. A portion of the CVD-Ti film on the PVD-Ti film may be converted into the metal silicide SIL.

Thus, by using the PVD-Ti film as raw material for the formation of the metal silicide SIL, it is possible to reduce the influence of an impurity such as chlorine (Cl) or carbon (C, organic matter) generated when the CVD-Ti film is used as a raw material and thereby form a desired metal silicide SIL. Thus, the metal silicide layer SIL thus formed can have improved stability. The PVD-Ti film described herein contains neither Cl (chlorine) nor C (carbon). Even when the metal silicide SIL is formed as a result of a reaction of not only the PVD-Ti film but also the CVD-Ti film thereon as described above, it has a Cl (chlorine) content of 10 at % or less.

Figure 6F:
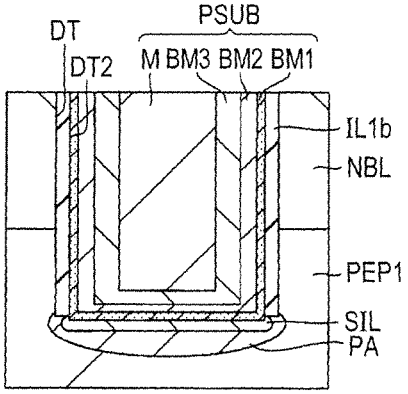

Next, as shown in FIG. 6E, a W film thick enough to completely fill the deep trench DT2 is formed as a metal film (main conductor film, which may also be called "blanket film") by CVD on the third barrier metal film BM3. For example, a CVD-W film is formed using a $WF_6$ gas which is a W compound gas. The deep trench DT2 and the contact hole C1 therefore have therein a stacked film of CVD-W film/CVD-TiN film/CVD-Ti film/PVD-Ti film. Next, a portion of the stacked film outside the deep trench DT2 and the contact hole C1 is removed by CMP (chemical mechanical polishing) to form a plug PSUB and a plug P1 (FIG. 6F).

In the above-described step, the silicidation is performed by making use of a heat load at the time of formation of the CVD-Ti film and the CVD-TiN film. The silicidation may be performed after the step of forming the PVD-Ti film but before formation of the CVD-Ti film. The silicidation may be performed before formation of the CVD-TiN film. The silicidation may be accelerated by applying a high heat load further after the step of forming the CVD-TiN film.

In the above step, a Ti film or a TiN film is used as the barrier metal film, but another metal film or metal compound film may be used instead. In the above step, the CVD-TiN film/CVD-Ti film/PVD-Ti film is used as the barrier film but it may be replaced by a CVD-TiN film/PVD-Ti film or CVD-Ti film/PVD-Ti film.

When a stacked film used as the barrier metal film includes not a PVD-metal film (for example, PVD-Ti film) but only a CVD-Ti film and a CVD-TiN film, contact resistance is not stabilized due to much variation in contact resistance, though $TiSi_X$ is formed at the boundary between the CVD-Ti film and the silicon layer lying therebelow. This is attributable to the above-described impurity such as chlorine (Cl) or carbon (C, organic matter). For example, by CVD, a CVD-Ti film can be formed using a $TiCl_4$ gas which is a Ti compound gas and a CVD-TiN film can be formed using a mixture of a $TiCl_4$ gas and $N_2$. Alternatively, the CVD-Ti film or CVD-TiN film can be formed by MOCVD (metal organic chemical vapor deposition) using an organic metal gas as a raw material.

Figure 7:
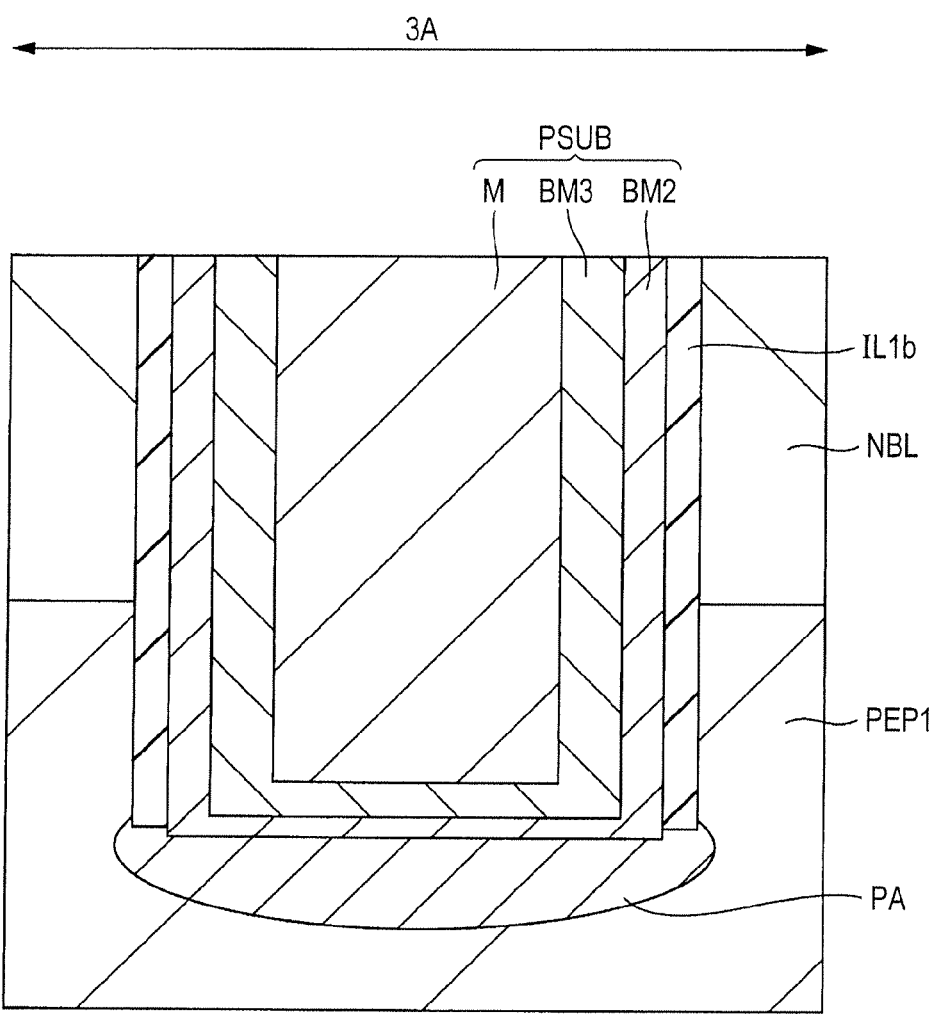
FIG. 7 is a cross-sectional view showing the configuration of a plug of Comparative Example.

The impurity, such as chlorine or carbon (organic matter), contained in the raw material gas affects the reaction between the CVD-Ti film and the silicon layer lying therebelow, resulting in formation of $TiSi_X$ having deteriorated stability. This means that some contacts have stably formed $TiSi_X$ and some contacts are inferior in the formation of $TiSi_X$ because as shown in FIG. 7, $TiSi_X$ is not practically formed at the bottom portion of the deep trench DT2. Thus, both a good contact and a defective contact exist in one wafer surface, between wafers, or between lots. FIG. 7 is a cross-sectional view showing the configuration of a plug of Comparative Example.

In the present embodiment, on the other hand, using the PVD film as the lowermost layer film can reduce the above-described influence of the impurity (chlorine or carbon) contained in the raw material gas. This makes it possible to uniformly form the metal silicide layer SIL at the boundary between the PVD-metal film and the silicon layer (or the silicon substrate) lying therebelow.

The PVD film is inferior in coverage property to the CVD film, but a stacked film of the PVD film and the CVD film having good coverage property can fully exhibit the function as a barrier metal film.

[Manufacturing Method]

Next, a method of manufacturing the semiconductor device of the present embodiment will be described and at the same time, the structure of it will be shown clearly referring to FIGS. 8 to 22. FIGS. 8 to 22 are cross-sectional views showing the steps of manufacturing the semiconductor device of the present embodiment.

First, as shown in FIG. 8, a semiconductor substrate having an epitaxial layer EP on a support substrate S is provided. The semiconductor substrate has the support substrate S made of p type single crystal silicon having, for example, a specific resistance of from about 1 to 10 Ωcm, a p⁻ type epitaxial layer PEP1 formed on the entire surface of the support substrate, and an n type epitaxial layer NBL formed thereon, and a p⁻ type epitaxial layer PEP2 formed thereon. The number or conductivity type of the constituent layers of the epitaxial layer EP (PEP1, NBL, PEP2) can be changed as needed. For example, the p⁻ type epitaxial layer PEP2 may have another conductivity type or a different impurity concentration.

The semiconductor substrate has a power feed region 3A, a second element formation region 2A, and a first element formation region 1A.

Here, an n type impurity is introduced into the p⁻ type epitaxial layer PEP2 of the first element formation region 1A in advance to make it into an n type. For example, with a photoresist film (not illustrated) having an opening portion in the first element formation region 1A as a mask, ion implantation of an n type impurity into the p⁻ type epitaxial layer PEP2 is performed to convert the p⁻type epitaxial layer PEP2 into an n⁻ type epitaxial layer NEP2. In other words, an n⁻ type epitaxial layer NEP2 is formed in the first element formation region 1A. Then, the photoresist film (not illustrated) is removed by ashing or the like (refer to FIGS. 5 and 9).

Figure 9:
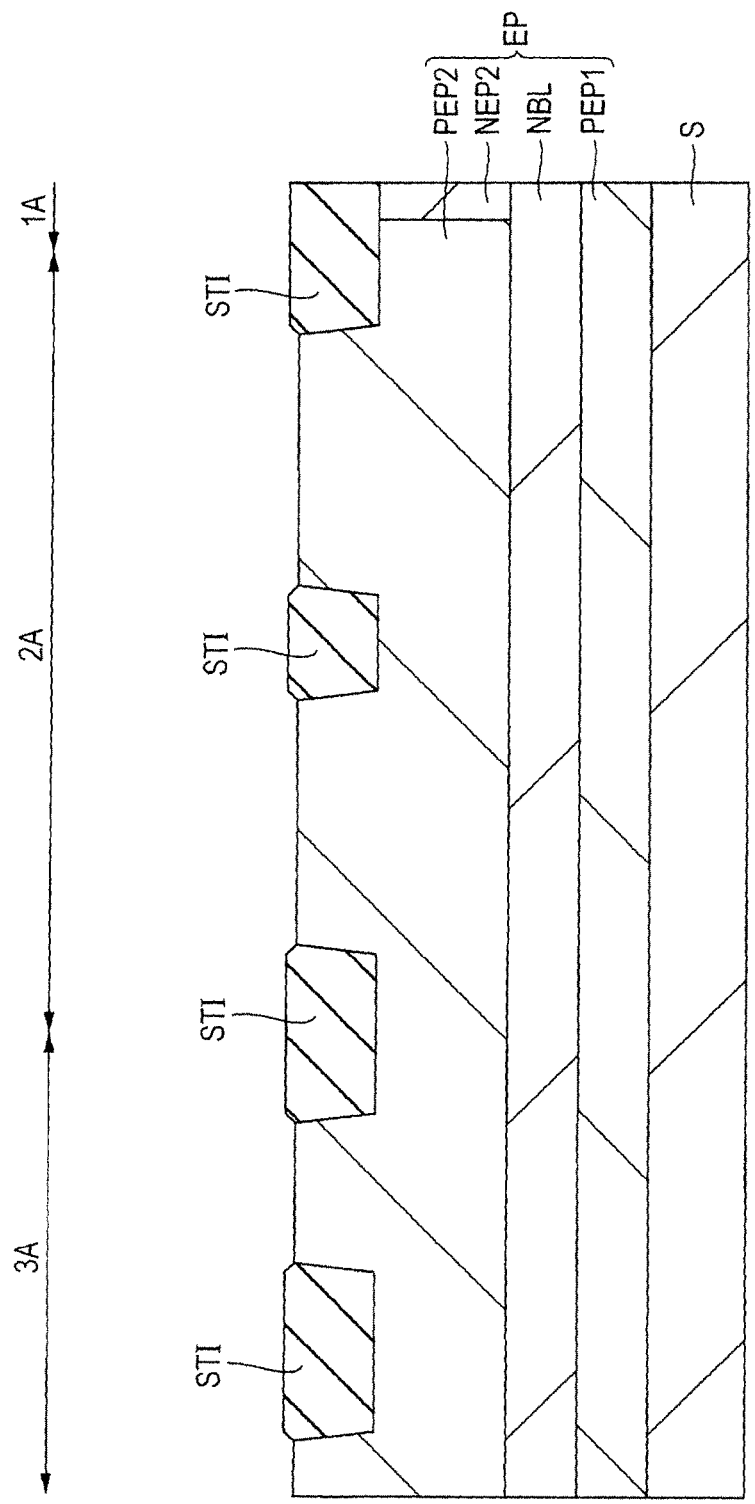
FIG. 9 is a cross-sectional view showing a step of manufacturing the semiconductor device of First Embodiment.

Then, an unillustrated hard mask (for example, a stacked film of a silicon oxide film and a silicon nitride film thereon) is formed on the semiconductor substrate. The hard mask and the epitaxial layer EP are etched to form an element isolation trench. Then, a silicon oxide film is deposited by CVD or the like on the hard mask and also in the element isolation trench, followed by removal of a portion of the silicon oxide film outside the element isolation trench by CMP or the like. Thus, the element isolation trench is filled with an insulating film such as silicon oxide film to form an insulation region STI (FIG. 9). Such an element isolation method is called "STI" (shallow trench isolation). At the same time, a drain insulation region STId configuring a LDMOS is also formed in the first element formation region 1A.

Figure 10:
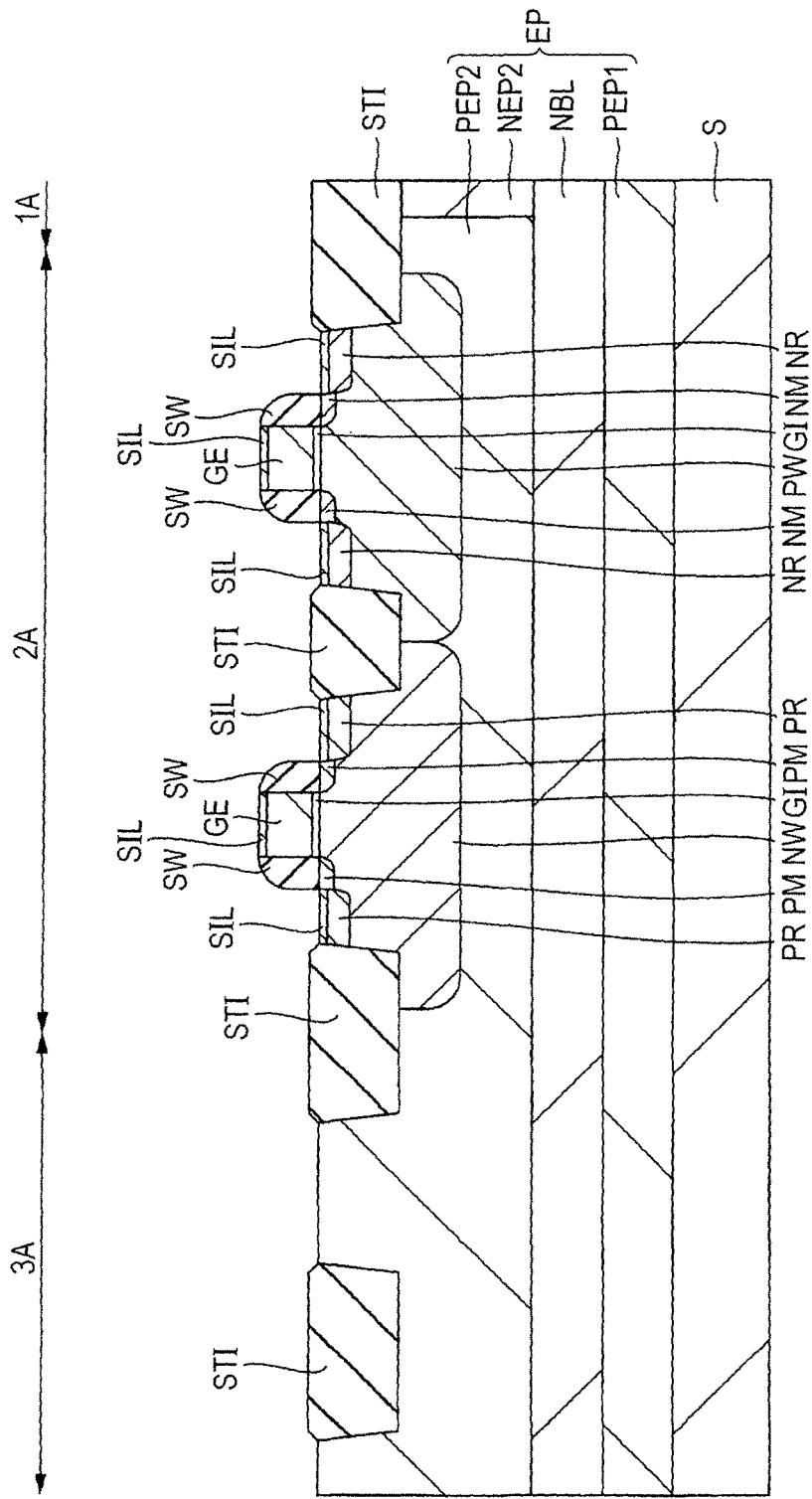
FIG. 10 is a cross-sectional view showing a step of manufacturing the semiconductor device of First Embodiment.
Figure 11:
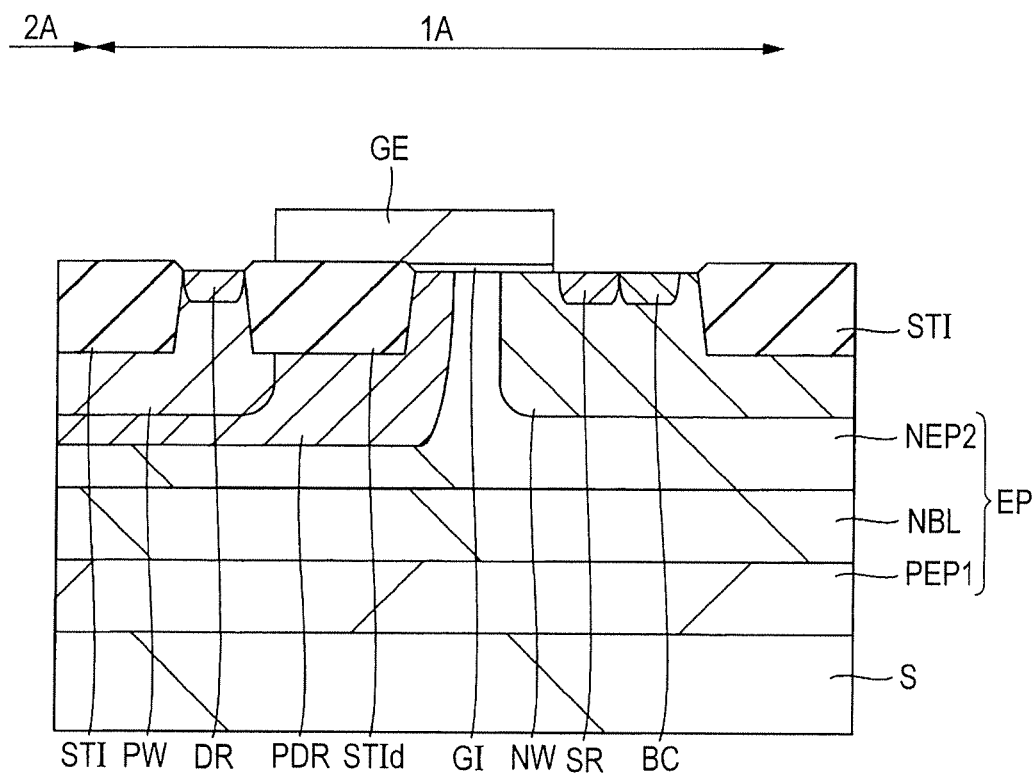
FIG. 11 is a cross-sectional view showing a step of manufacturing the semiconductor device of First Embodiment.

Next, a LDMOS transistor is formed on the main surface of the semiconductor substrate in the first element isolation region (n⁻ type epitaxial layer NEP2) 1A, while CMOS transistors (n type MOS transistor and p type MOS transistor) are formed on the main surface of the second element formation region (p⁻ type epitaxial layer PEP2) 2A (FIGS. 10 and 11).

The step of forming the LDMOS transistor or CMOS transistor is not limited, but one example of the formation step will hereinafter be described.

First, the LDMOS transistor is formed (FIG. 11). In the first element formation region 1A, a p type drift region PDR and an n type well region NW are formed in the n⁻ type epitaxial layer NEP2. For example, with a photoresist mask (not illustrated) opened at the formation region of the p type drift region PDR as a mask, ion implantation of a p type impurity into the n⁻ type epitaxial layer NEP2 is performed to form the p type drift region (p type semiconductor region) PDR. Next, the photoresist film (not illustrated) is removed by ashing or the like. Then, with a photoresist film (not illustrated) opened at the formation region of the n type well region as a mask, ion implantation of an n type impurity into the n⁻ type epitaxial layer NEP2 is performed to form the n type well region (n type semiconductor region) NW. Then, the photoresist film (not illustrated) is removed by ashing or the like.

Next, a p type well region PW is formed in the p type drift region PDR. For example, with a photoresist film (not illustrated) opened at the formation region of the p type well region PW as a mask, ion implantation of a p type impurity into the n⁻ type epitaxial layer NEP2 is performed to form the p type well region PW (p type semiconductor region). Then, the photoresist film (not illustrated) is removed by ashing or the like.

Then, a gate insulating film GI and a gate electrode GE are formed. The gate insulating film GI made of a silicon oxide film or the like is formed on the surface of the n⁻ type epitaxial layer NEP2 by the thermal treatment (thermal oxidation treatment) of the semiconductor substrate. As the gate insulating film GI, the thermal oxidation film may be replaced by a film formed by CVD. Not only an oxide film but a nitride film or a high dielectric constant film (High-k film) may be used. Then, a polycrystalline silicon film (gate electrode layer) is deposited as a conductive film on the gate insulating film GI by CVD or the like. The resulting film is patterned using photolithography and dry etching. Described specifically, a photoresist film (not illustrated) is formed on the polycrystalline silicon film (gate electrode layer), followed by exposure and development by photolithography to remove a portion of the photoresist film outside the formation region of the gate electrode GE. Then, with the photoresist film as a mask, the polycrystalline film (gate electrode layer) is dry etched to form the gate electrode GE. The resulting gate electrode GE extends even to above the drain insulation region STId, starting from above the n type well region and crossing the p type drift region PDR. During this etching, the gate insulating film GI below the polycrystalline silicon film is also etched. Then, the photoresist film is removed by ashing or the like.

Then, a source region SR and a drain region DR are formed. For example, with a photoresist film having a predetermined shape (not illustrated) as an ion implantation preventing mask, a p type impurity is ion-implanted into a predetermined region. Here, a p type impurity is ion-implanted into the p type well region PW on one side of the gate electrode GE (on the left side in this drawing) and a p type impurity is ion implanted into the n type well region NW on the other side (on the right side in the drawing) of the gate electrode GE.

As a result, a p⁺ type drain region DR is formed in the surface of a portion of the p type well region PW and a p⁺ type source region SR is formed in the surface of a portion of the n type well region. The p⁺ type source region SR is formed in self alignment with the gate electrode GE.

Further, with a photoresist film having a predetermined shape (not illustrated) as an ion implantation preventing mask, an n type impurity is ion-implanted to form a n⁺ type body contact region BC in the n type well region NW. The n⁺ type body contact region BC and the p⁺ type source region SR are adjacent to each other and configure a pn junction. Then, heat treatment (activation treatment) is performed in order to activate the impurities introduced into the respective regions.

By the above steps, the LDMOS transistor can be formed.

Then, the CMOS transistors (n type MOS transistor and p type MOS transistor) are formed (FIG. 10). In the second element formation region 2A, a p type well region PW and an n type well region NW are formed in the p⁻ type epitaxial layer PEP2. For example, with a photoresist film (not illustrated) opened at the formation region of the p type well region PW as a mask, a p type impurity is ion-implanted into the p⁻ type epitaxial layer PEP2 to form the p type well region PW. Then, the photoresist film (not illustrated) is removed by ashing or the like. Then, with a photoresist film (not illustrated) opened at the formation region of the n type well region NW as a mask, an n type impurity is ion-implanted into the p⁻ type epitaxial layer PEP2 to form the n type well region NW. Then, the photoresist film (not illustrated) is removed by ashing or the like.

Then, a gate insulating film GI and a gate electrode GE are formed. The gate insulating film GI made of a silicon oxide film or the like is formed on the surface of the p type well region PW and the n type well region NW by heat treatment (thermal oxidation treatment) of the semiconductor substrate. As the gate insulating film GI, the thermal oxide film may be replaced by a film formed by CVD. Not only the oxide film but also a nitride film or high-dielectric-constant film (High-k) film may be used instead. Then, a polycrystalline silicon film (gate electrode layer) is deposited on the gate insulating film GI by CVD or the like as a conductive film. The resulting film is patterned using photolithography and dry etching to form the gate electrode GE.

Then, source and drain regions having an LDD structure are formed in the p⁻ type epitaxial layer PEP2 on both sides of the gate electrode GE. For example, an n⁻ type semiconductor region NM is formed by covering the formation region of a p type MOS transistor (n type well region NW) with a photoresist film or the like and implanting an n type impurity (n type impurity ion) such as arsenic (As) or phosphorus (P) into the p type well region PW on both sides of the gate electrode GE. The n⁻ type semiconductor region NM is formed in self alignment with the side wall of the gate electrode GE. Then, the photoresist film (not illustrated) is removed by ashing or the like. Then, a p⁻ type semiconductor region PM is formed by covering the formation region of an n type MOS transistor (p type well region PW) with a photoresist film or the like and implanting a p type impurity (p type impurity ion) such as boron (B) into the n type well region NW on both sides of the gate electrode GE. The p⁻ type semiconductor region PM is formed in self alignment with the side wall of the gate electrode GE. Then, the photoresist film (not illustrated) is removed by ashing or the like.

Then, a sidewall insulating film SW is formed on the side wall portion of the gate electrode GE. The sidewall insulating film SW is formed on the side wall portion of the gate electrode GE, for example, by depositing an insulating film such as silicon oxide film in the first element formation region 1A and then etching back this insulating film. As the sidewall insulating film SW, an insulating film such as a single-layer silicon oxide film, a single-layer silicon nitride film, or a stacked film of a silicon oxide film and a silicon nitride film may be used.

Then, an n⁺ type semiconductor region NR is formed, for example, by covering the formation region of the p type MOS transistor (n type well region NW) with a photoresist film and then, implanting an type impurity such as arsenic (As) or phosphorus (P) into the p type well region PW with the gate electrode GE and the sidewall insulating film SW as a mask. The n⁺ type semiconductor region NR is formed in self alignment with the sidewall insulating film SW on the side wall of the gate electrode GE. Then, the photoresist film (not illustrated) is removed by ashing or the like. A p⁺ type semiconductor region PR is then formed, for example, by covering the formation region of the n type MOS transistor (p type well region PW) with a photoresist film or the like and implanting a p type impurity such as boron (B) into the n type well region NW with the gate electrode GE and the sidewall insulating film SW as a mask. The p⁺ type semiconductor region PR is formed in self alignment with the sidewall insulating film SW on the side wall of the gate electrode GE. Then, the photoresist film (not illustrated) is removed by ashing or the like. Thus, source and drain regions having an LDD structure comprised of the n⁻ type semiconductor region NM and the n⁺ type semiconductor region NR are formed and also source and drain regions having an LDD structure comprised of the p⁻ type semiconductor region PM and the p⁺ type semiconductor region PR are formed. The n⁺ type semiconductor region NR has an impurity concentration higher and a junction depth deeper than those of the n⁻ type semiconductor region NM. The p⁺ type semiconductor region PR has an impurity concentration higher and a junction depth deeper than those of the p⁻ type semiconductor region PM.

Next, heat treatment (activation treatment) is performed for activating the impurities introduced into the source and drain regions.

By the above-described steps, the CMOS transistors can be formed. After that, a metal silicide layer SIL is formed on each of the source and drain regions (n⁺ type semiconductor regions NR, p⁺ type semiconductor regions PR) and the gate electrode GE by the salicide technology. This metal silicide layer SIL can reduce the resistance such as diffusion resistance and contact resistance. For example, $CoSi_X$ (cobalt silicide) can be formed as the metal silicide layer SIL on each of the source and drain regions (n⁺ type semiconductor regions NR, p⁺ type semiconductor regions PR) and also on the gate electrode GE by forming, for example, a Co film as a metal film in the first element formation region 1A, heat treating the semiconductor substrate to react the source and drain regions with the resulting metal film and also react the gate electrode GE with the metal film. Then, an unreacted portion of the metal film is removed.

The LDMOS transistor or CMOS transistor formation steps are shown only by way of example and they may be replaced by other manufacturing steps. With respect to the formation order, the formation of the LDMOS transistor may be followed by the formation of the CMOS transistor or the formation of the CMOS transistor may be followed by the formation of the LDMOS transistor. Semiconductor regions, gate insulating films, or gate electrodes having the same conductivity type may be formed by one step. For example, the p type well region PW in the first element formation region 1A and the p type well region PW in the second element formation region 2A may be formed by one ion implantation step, while the n type well region NW in the first element formation region 1A and the n type well region in the second element formation region 2A may be formed in one ion implantation step. The gate insulating film GI of the LDMOS transistor and the gate insulating film GI of each of the n type MOS transistor and the p type MOS transistor configuring the CMOS transistor may be formed by one step. The gate electrode GE of the LDMOS transistor and the gate electrode GE of each of the n type MOS transistor and the p type MOS transistor configuring the CMOS transistor may be formed by one step. Thus, similar component sites can be formed by a common manufacturing step.

Figure 12:
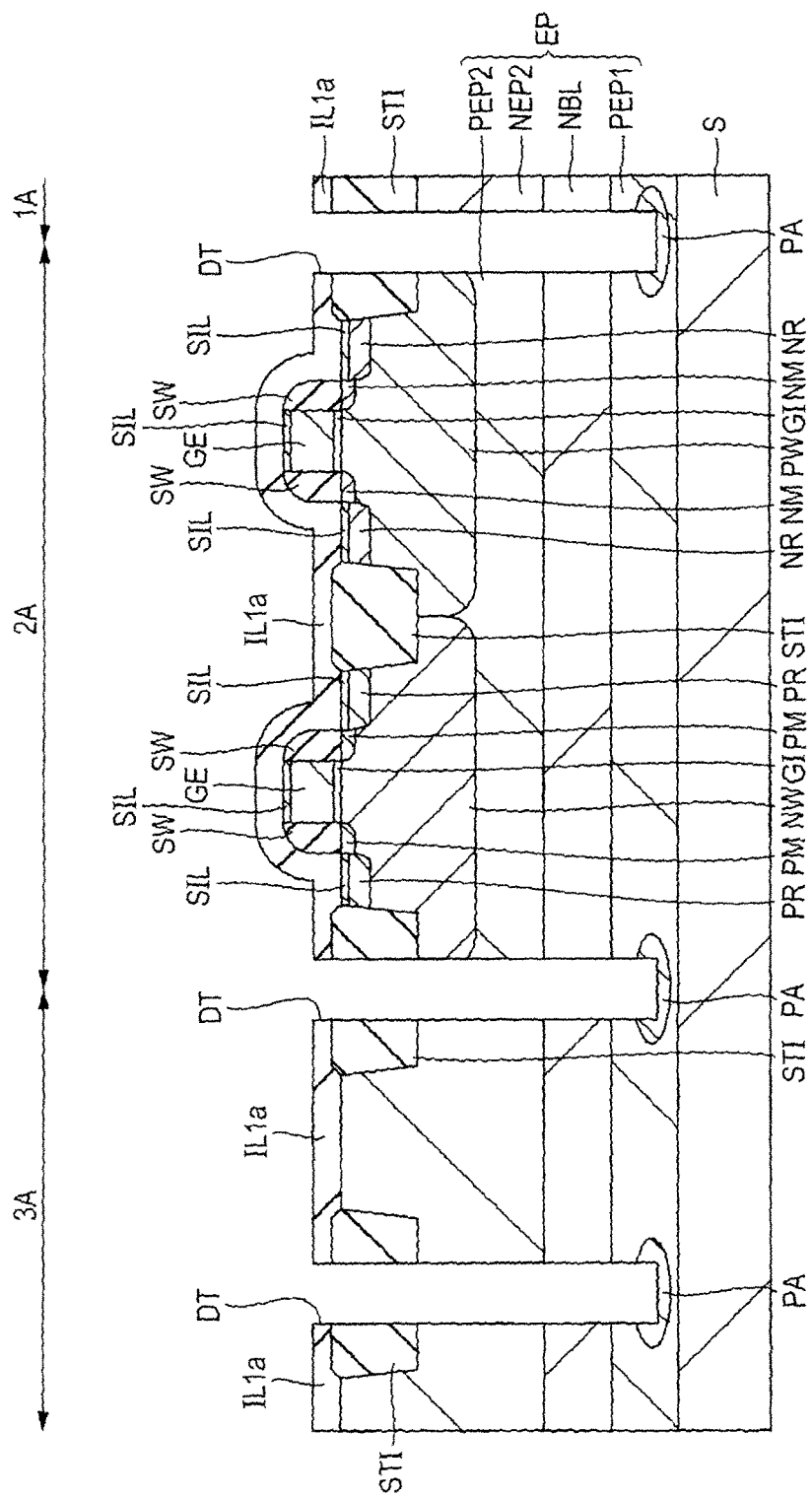
FIG. 12 is a cross-sectional view showing a step of manufacturing the semiconductor device of First Embodiment.
Figure 13:
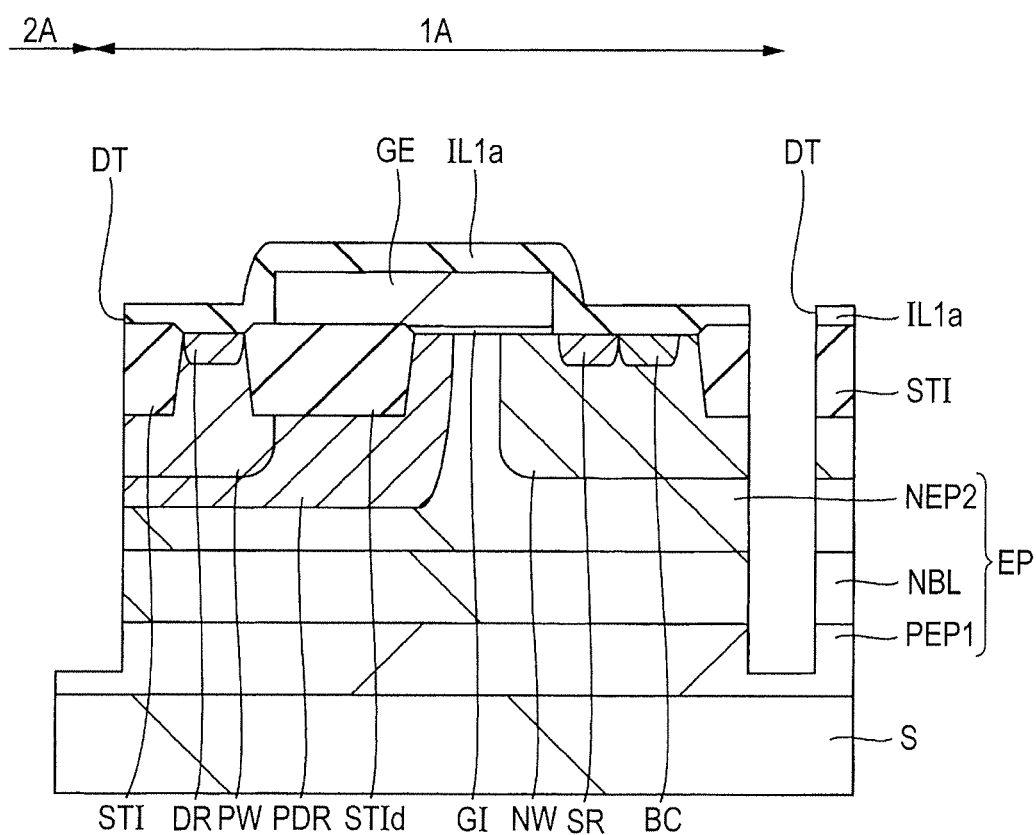
FIG. 13 is a cross-sectional view showing a step of manufacturing the semiconductor device of First Embodiment.

Next, as shown in FIGS. 12 and 13, an insulating film IL1a such as silicon oxide film is formed by CVD or the like on the semiconductor substrate (the p⁻ type epitaxial layer PEP2, the n⁻ type epitaxial layer NEP2). Then, with a photoresist film (not illustrated) having an opening in the deep trench DT formation region, the insulating film IL1a is etched. Then, the photoresist film (not illustrated) is removed and with the insulating film IL1a as a mask, the semiconductor substrate (the p⁻ type epitaxial layer PEP2, the n⁻ type epitaxial layer NEP2, the n type epitaxial film NBL, and the like) is etched to form a deep trench DT. The bottom portion of the deep trench DT reaches, for example, the p⁻ type epitaxial layer PEP1. The deep trench DT is provided at the substantially center portion of the insulation region STI which defines the active region. The deep trench DT therefore surrounds therewith an active region in which the LDMOS transistor is to be formed or an active region in which the CMOS transistor is to be formed (FIG. 4). In other words, the deep trench DT is placed in the circumferential region of the first element formation region 1A or second element formation region 2A. Also in the power feed region 3A, a substantially rectangular (linear) deep trench DT is formed.

Then, a p type impurity region PA is formed by implanting a p type impurity such as boron (B) into the p⁻ type epitaxial layer PEP1 exposed from the bottom surface of the deep trench DT while covering the first element formation region 1A with a photoresist film or the like. Then, the photoresist film (not illustrated) is removed by ashing or the like. This removal may be followed by heat treatment (activation treatment) for activating the impurity thus introduced.

Figure 14:
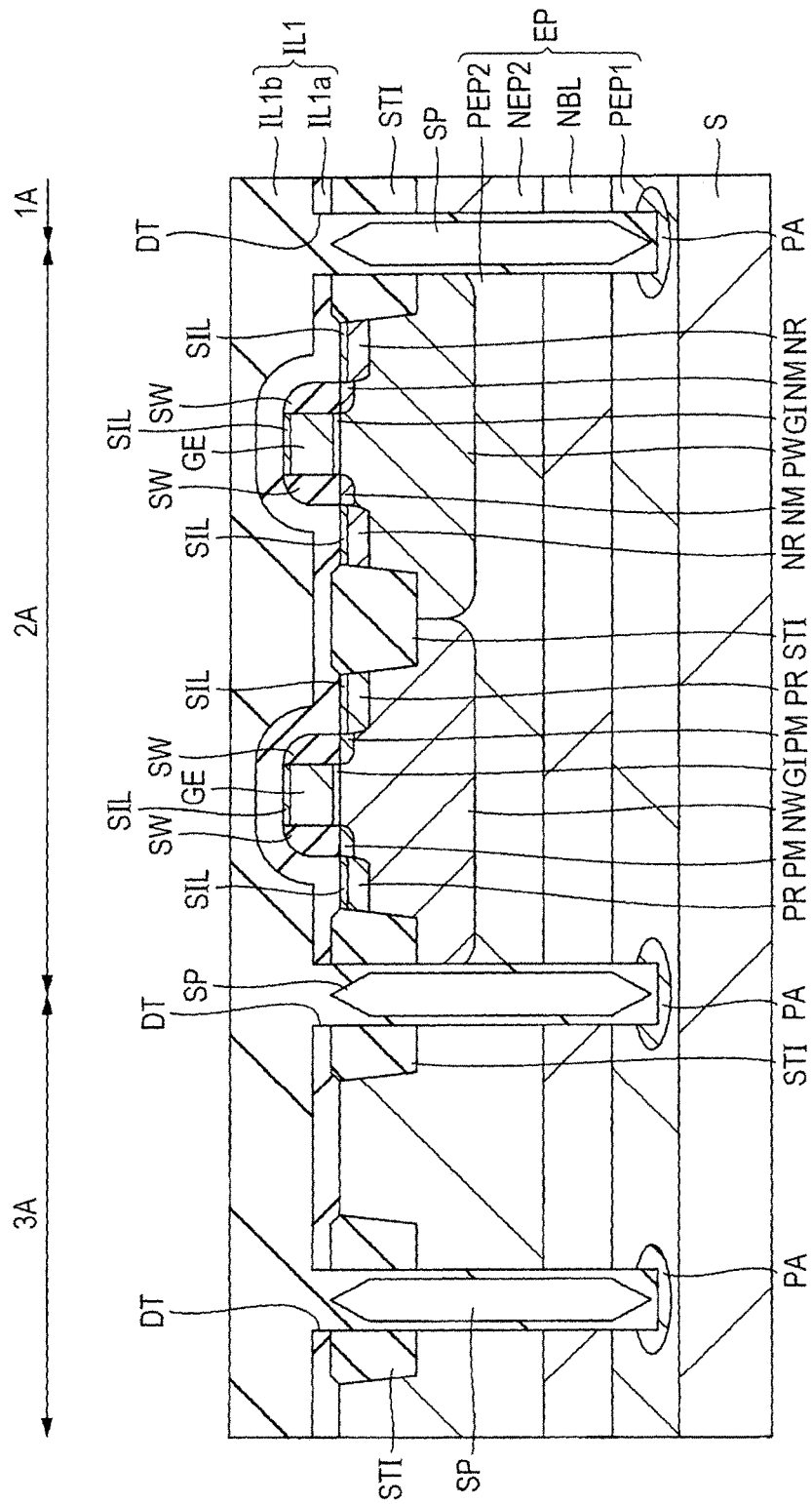
FIG. 14 is a cross-sectional view showing a step of manufacturing the semiconductor device of First Embodiment.
Figure 15:
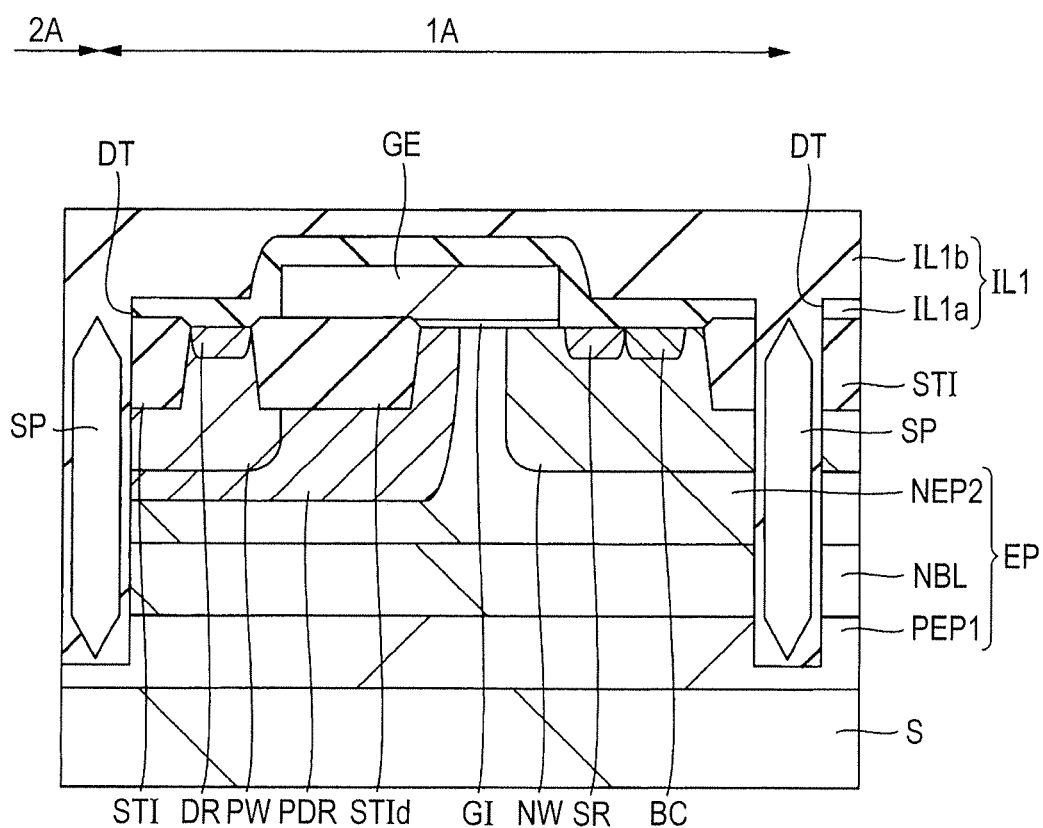
FIG. 15 is a cross-sectional view showing a step of manufacturing the semiconductor device of First Embodiment.

Next, as shown in FIGS. 14 and 15, an insulating film IL1b made of a silicon oxide film or the like is deposited by CVD or the like on the semiconductor substrate including the inside of the deep trench DT. The silicon oxide film formed inside the deep trench DT may have therein a space SP. The upper portion of the silicon oxide film is then planarized by CMP or the like. The silicon oxide film is formed such that the upper surface thereof after planarization becomes higher than the upper surface of the insulating film IL1a on the gate electrode GE. An interlayer insulating film IL1 comprised of the insulating films IL1a and IL1b is thus formed.

Figure 16:
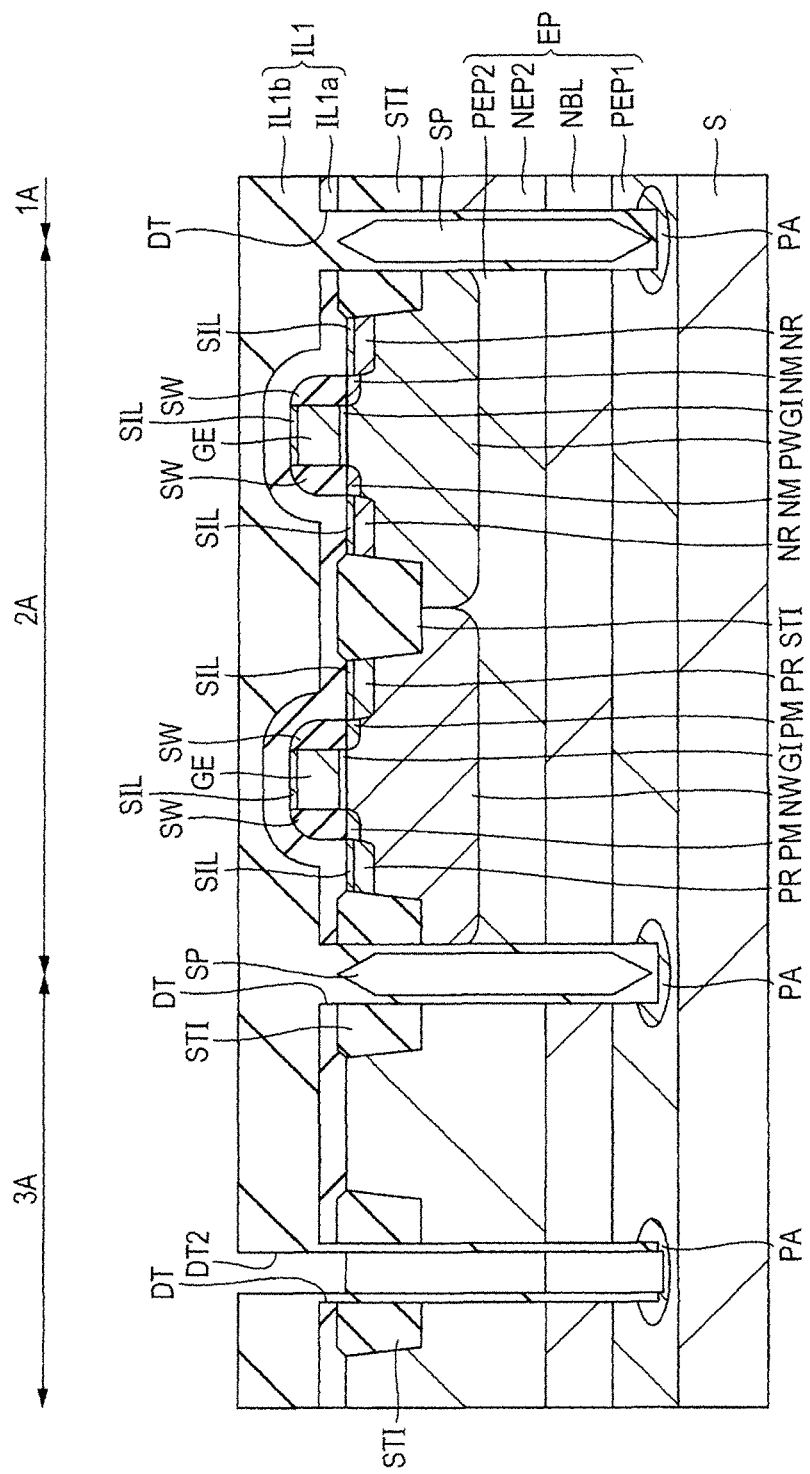
FIG. 16 is a cross-sectional view showing a step of manufacturing the semiconductor device of First Embodiment.

Next, as shown in FIG. 16, a deep trench DT2 is formed in the power feed region 3A. The deep trench DT2 is formed inside the deep trench DT by etching the insulating film IL1b with a photoresist film (not illustrated) having an opening in the plug PSUB formation region of the power feed region 3A with a mask. The deep trench DT2 can be formed more easily if the deep trench DT has therein a space SP. The insulating film IL1b may remain on the side wall of the deep trench DT2. From the bottom surface of the deep trench DT2, the p type impurity region PA is exposed. Then, the photoresist film (not illustrated) is removed by ashing or the like.

Figure 17:
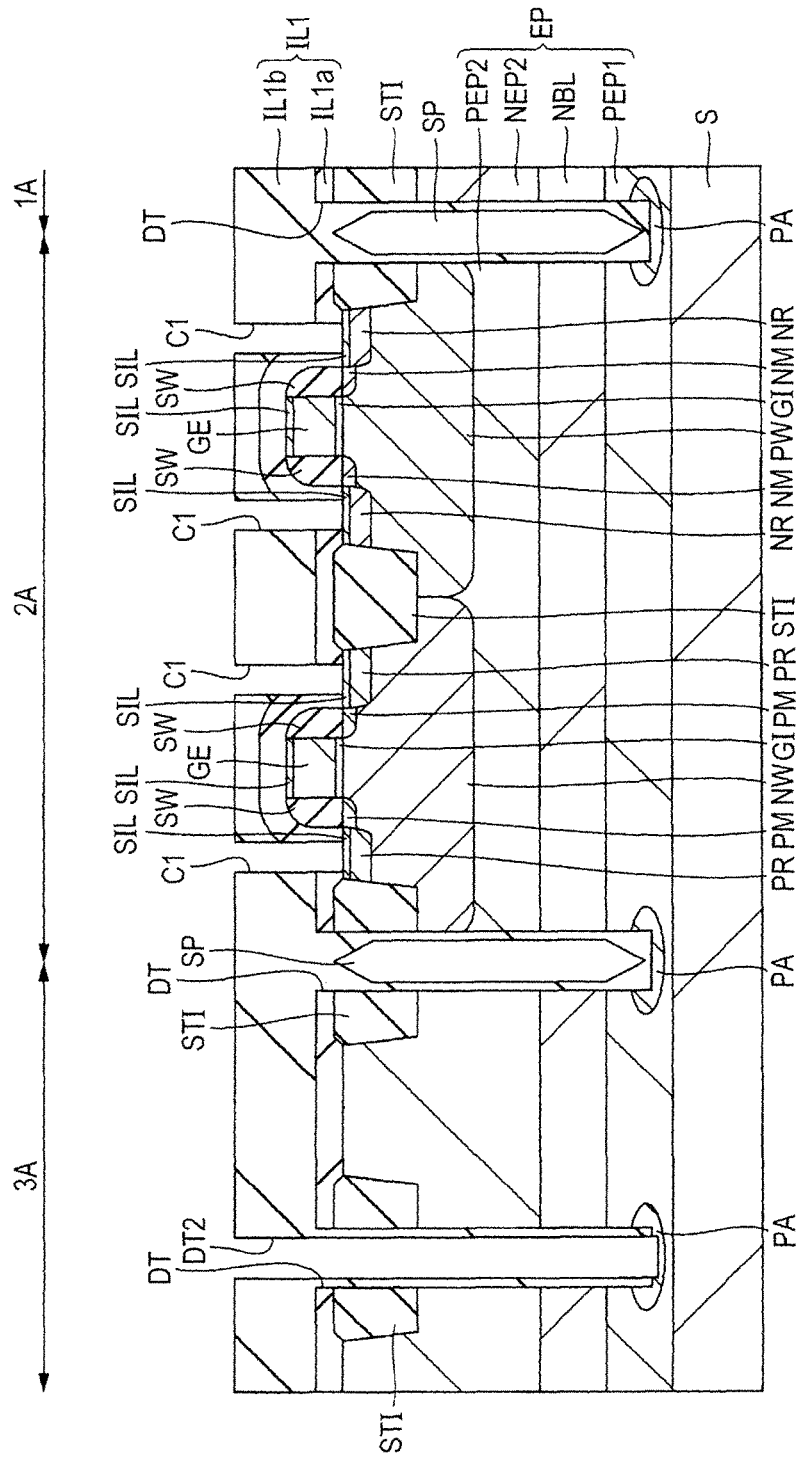
FIG. 17 is a cross-sectional view showing a step of manufacturing the semiconductor device of First Embodiment.
Figure 18:
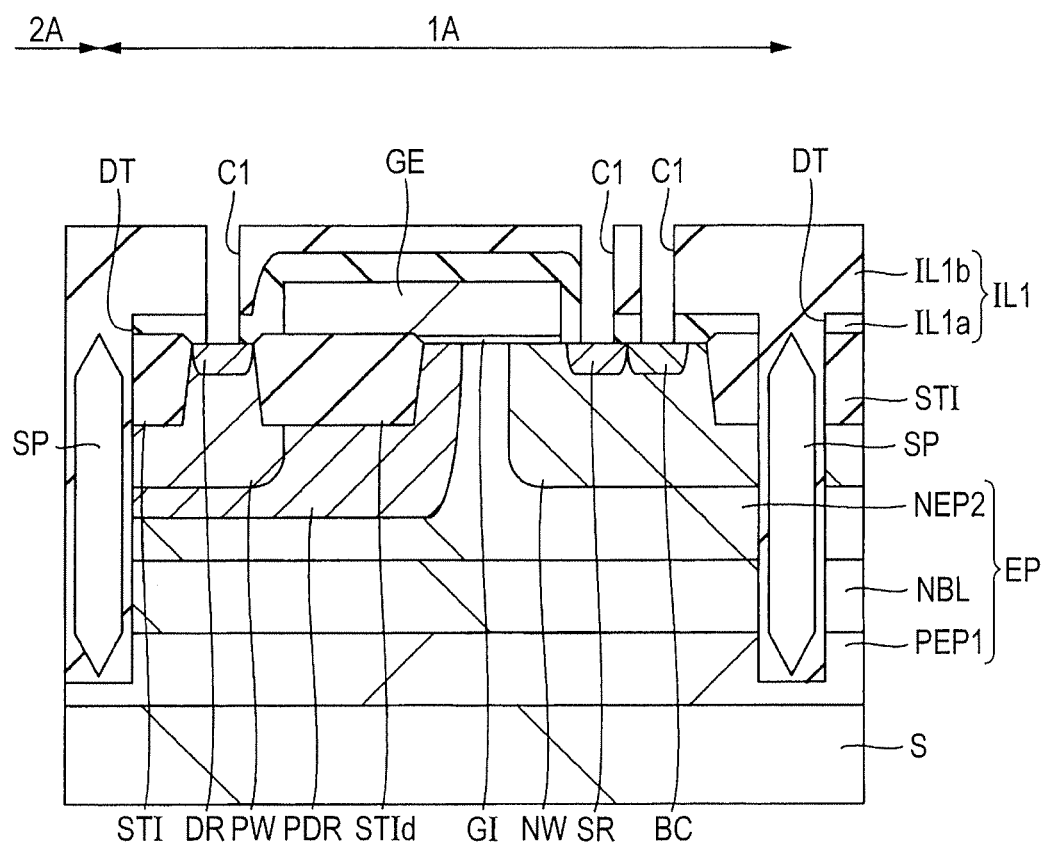
FIG. 18 is a cross-sectional view showing a step of manufacturing the semiconductor device of First Embodiment.

Then, as shown in FIGS. 17 and 18, a contact hole C1 is formed by etching the insulating films IL1b and IL1a while using a photoresist film (not illustrated) having an opening in the plug P1 formation region as a mask. In the inner region of the second element formation region 2A, this contact hole C1 is formed on the source and drain regions (n⁺ type semiconductor regions NR, p⁺ type semiconductor regions PR) or the gate electrode GE. In the first element formation region 1A, the contact hole C1 is formed on the source region SR, the drain region DR or the n⁺ type body contact region BC. Thus, the contact hole C1 is formed on the component of each of the transistors.

Figure 19:
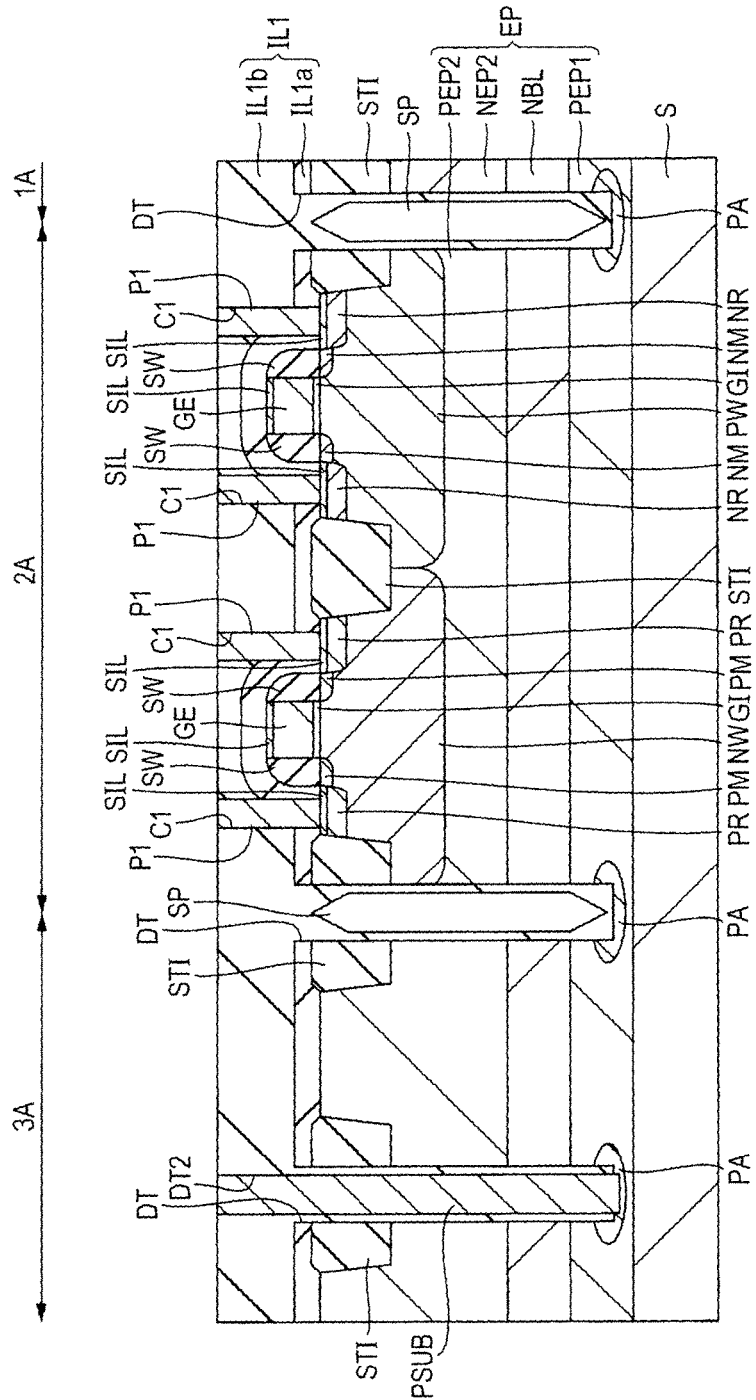
FIG. 19 is a cross-sectional view showing a step of manufacturing the semiconductor device of First Embodiment.
Figure 20:
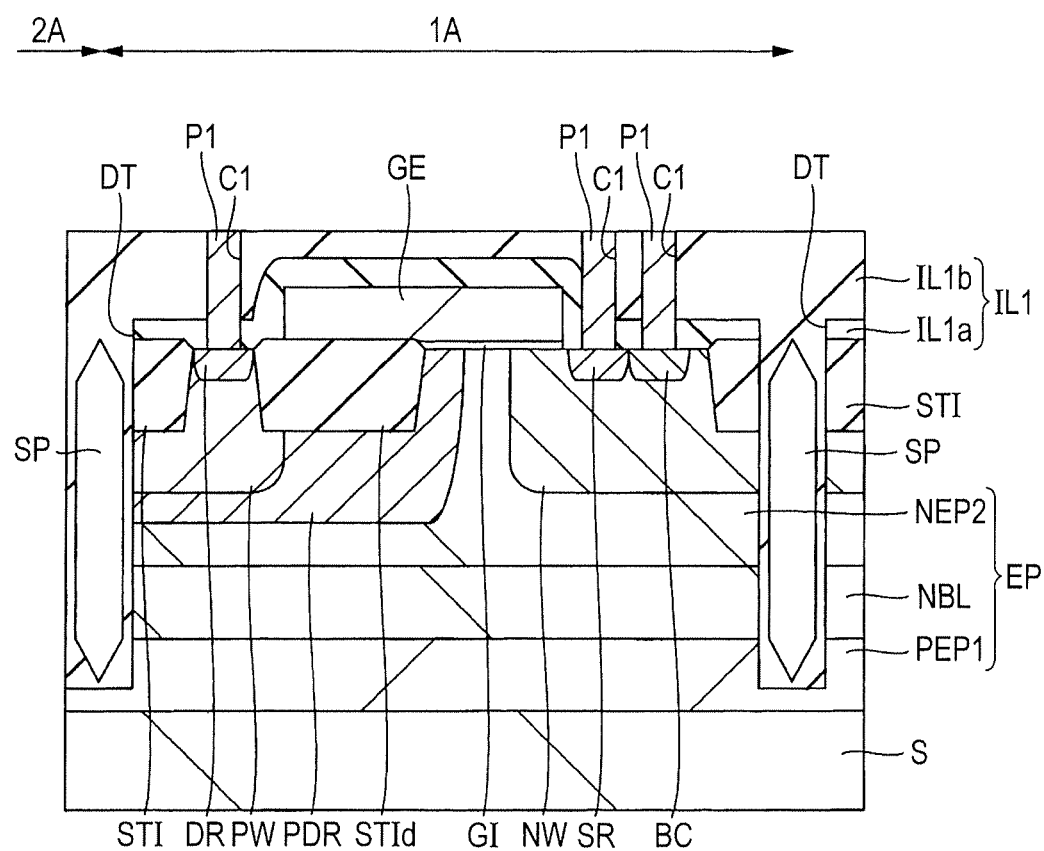
FIG. 20 is a cross-sectional view showing a step of manufacturing the semiconductor device of First Embodiment.

Next, as shown in FIGS. 19 and 20, plugs PSUB and P1 are formed by filling the deep trench DT2 and the contact hole C1 with a conductive film (conductor). This means that a conductive film is deposited on the insulating film IL1b and also in the plugs PSUB and P1 and then an unnecessary portion of the conductive film on the insulating film IL1b is removed by CMP or etch back. Described specifically, as described referring to FIG. 6, after deposition of a stacked film of CVD-W film/CVD-TiN film/CVD-Ti film/PVD-Ti film, an upper portion of the stacked film is removed by CMP or etch back until the insulating film IL1b is exposed. Since a PVD film is used as the lowermost layer of the CVD-TiN film/CVD-Ti film/PVD-Ti film which are barrier metals, the metal silicide layer SIL can be formed stably and the contact resistance can be stabilized as described above. In addition, due to the CVD films such as CVD-TiN film and CVD-Ti film, the function as a barrier metal can be maintained. A fine contact hole C1 can also be filled better with such a barrier metal simultaneously.

Figure 21:
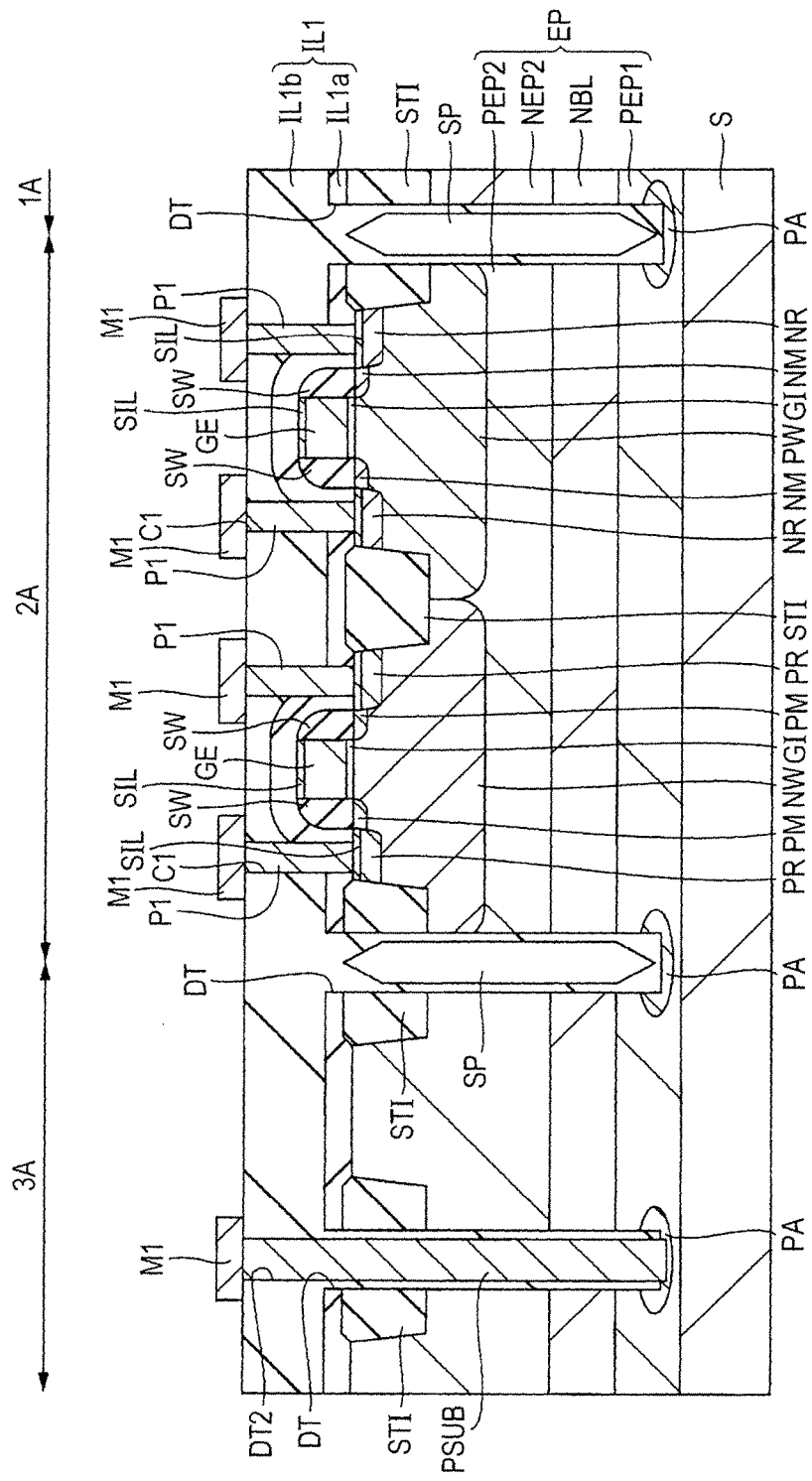
FIG. 21 is a cross-sectional view showing a step of manufacturing the semiconductor device of First Embodiment.
Figure 22:
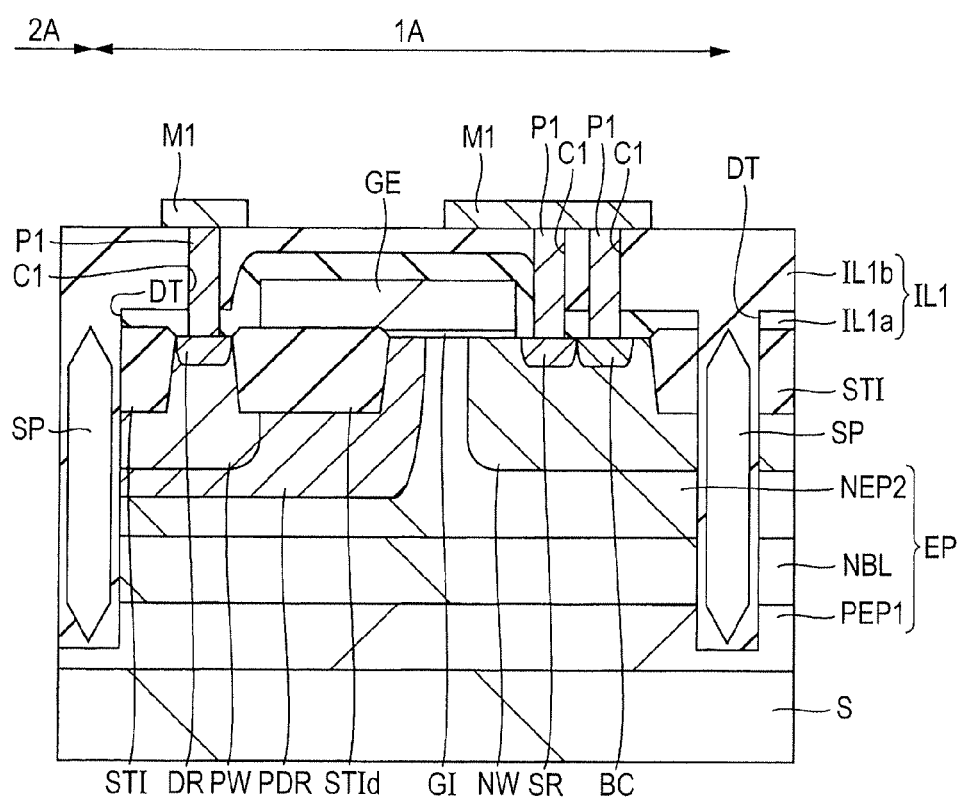
FIG. 22 is a cross-sectional view showing a step of manufacturing the semiconductor device of First Embodiment.

Next, as shown in FIGS. 21 and 22, a wiring M1 is formed as a first-layer wiring on the interlayer insulating film IL1 comprised of the insulating film IL1a and the insulating film IL1b. For example, a barrier metal film made of a TiN film/Ti film and an Al film are deposited as a conductive film by sputtering or the like on the interlayer insulating film IL1 and the resulting film is patterned into the wiring M1.

Then, an insulating film such as silicon oxide film is formed as an interlayer insulating film IL2 on the interlayer insulating film Il1 and also on the wiring M1 by CVD or the like. Then, a plug P2 is formed by forming a contact hole in the interlayer insulating film IL2 and filling the hole with a conductive film. Then a wiring M2 which is a second-layer wiring is formed on the interlayer insulating film IL2, followed by the formation of an interlayer insulating film IL3. The plug P2, the wiring M2, and the interlayer insulating film IL3 can be formed in a manner similar to that of the plug P1, the wiring M2 and the interlayer insulating film IL2 (refer to FIGS. 1 and 5). Upper-layer wirings may be formed further. A passivation film which will be a protective film is formed on the uppermost-layer wiring. The wiring may be formed using a damascene process instead of patterning.

The semiconductor device of First Embodiment is manufactured as described above.

Second Embodiment

In First Embodiment, the plugs PSUB and P1 are each comprised of a stacked film of CVD-W film/CVD-TiN film/CVD-Ti film/PVD-Ti film but they may each be comprised of CVD-W film/CVD-TiN film/PVD-Ti film.
[Structure]

Figure 23:
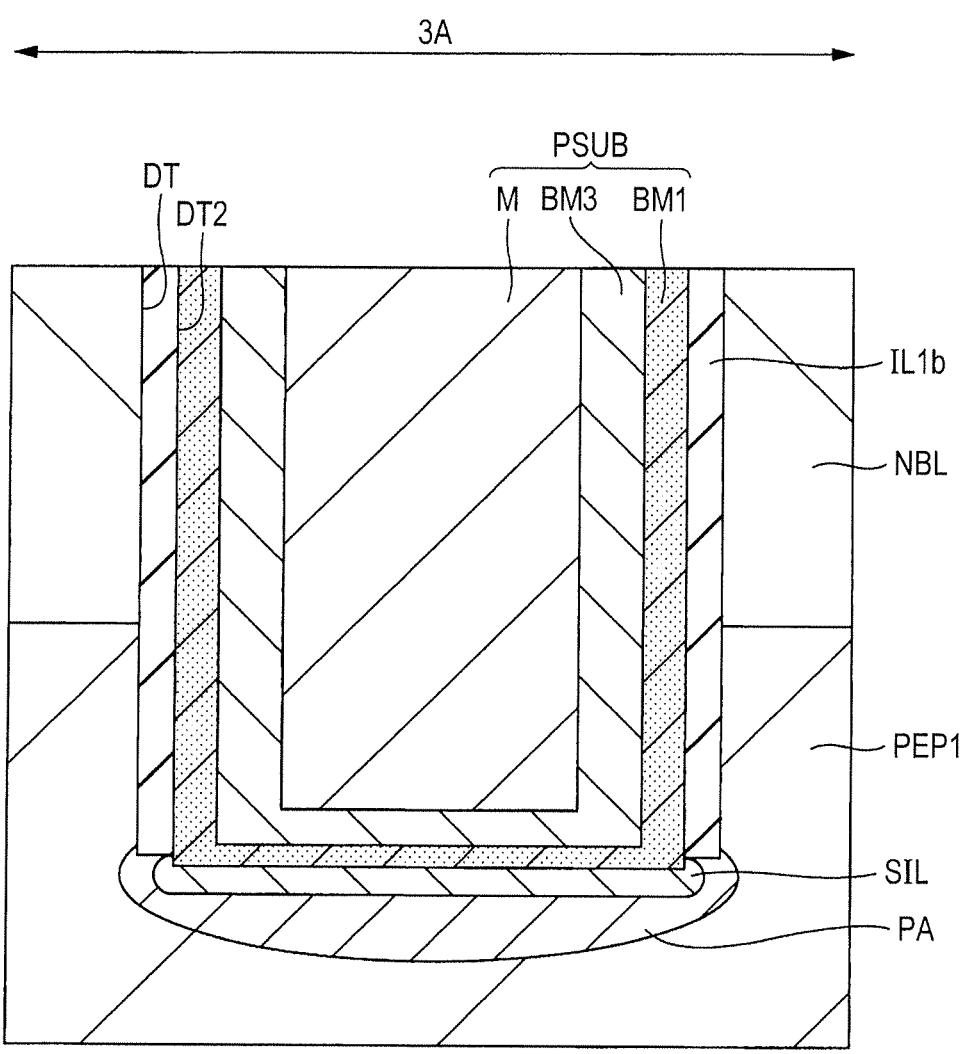
FIG. 23 is a cross-sectional view showing the configuration of a semiconductor device of Second Embodiment.

FIG. 23 is a cross-sectional view showing the configuration of a semiconductor device of the present embodiment. The configuration of the semiconductor device is similar to that of First Embodiment (FIGS. 1, 4, and 5) except for plugs PSUB and P1 so that only that of plugs will hereinafter be described.

As shown in FIG. 23, the plug PSUB is comprised of CVD-W film/CVD-TiN film/PVD-Ti film with which the deep trench DT2 is filled. The CVD-TiN film has a thickness of, for example, about 10 nm and the PVD-Ti film has a thickness of about 5 nm. The plug P1 is, similar to the plug PSUB, comprised of CVD-W film/CVD-TiN film/PVD-Ti film with which the contact hole C1 is filled.

Also in the present embodiment, since a PVD-metal film (metal film formed by PVD) is used as the first barrier metal film BM1 which is a barrier metal film of the lowermost layer configuring the plug PSUB, a metal silicide layer SIL can be formed stably at the boundary between the PVD-metal film and the silicon layer (or silicon substrate) lying therebelow. The present embodiment can therefore produce an advantage similar to that of First Embodiment such as stabilization of contact resistance.

In the present embodiment, the barrier metal film is comprised of two layers (CVD-TiN film/PVD-Ti film) so that the barrier film can be made thinner than the three-layer barrier metal film of First Embodiment. The contact hole C1 can therefore be filled better.
[Manufacturing Method]

Steps of manufacturing the semiconductor device of the present embodiment are similar to those of First Embodiment (refer to FIGS. 8 to 22) except for the steps of forming plugs PSUB an P1 so that only plug formation steps will hereinafter be described.

When plugs PSUB and P1 are formed, the CVD-Ti film formation step is omitted from the plug P1 formation steps (refer to FIG. 6) of First Embodiment and a stacked film comprised of CVD-TiN film/PVD-Ti film may be formed as a barrier metal film.

Third Embodiment

Figure 24:
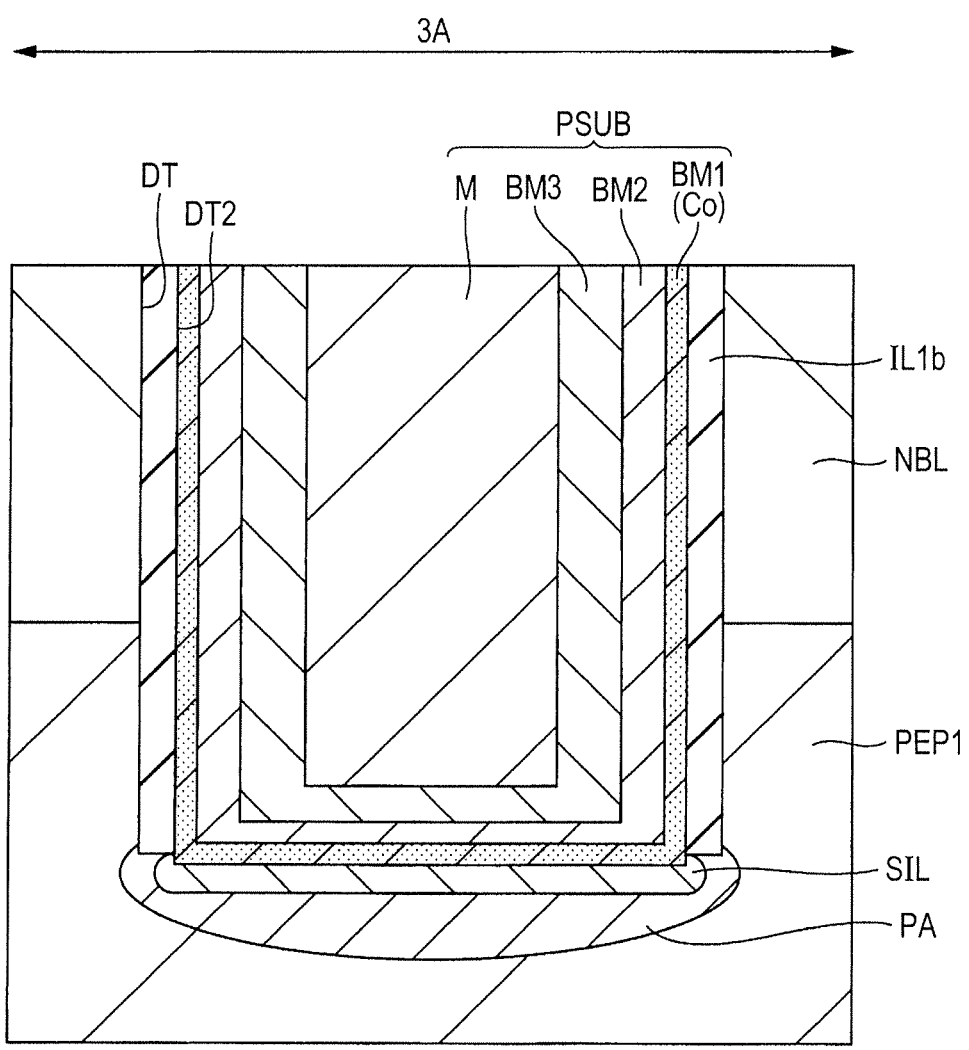
FIG. 24 is a cross-sectional view showing the configuration of a semiconductor device of Third Embodiment.

The plugs PSUB and P1 in the above-described First Embodiment are each comprised of a stacked film of CVD-W film/CVD-TiN film/CVD-Ti film/PVD-Ti film. Alternatively, they may be comprised of a stacked film of CVD-W film/CVD-TiN film/CVD-Ti film/PVD-Co film.
[Structure]
FIG. 24 is a cross-sectional view showing the configuration of a semiconductor device of the present embodiment. The semiconductor device of the present embodiment is similar to that of First Embodiment (FIGS. 1, 4, and 5) except for the configuration of each of plugs PSUB and P1 so that the configuration of only these plugs will hereinafter be described.

As shown in FIG. 24, the plug PSUB is comprised of CVD-W film/CVD-TiN film/CVD-Ti film/PVD-Co film with which the deep trench DT2 is filled. The plug P1 is, similar to the plug PSUB, comprised of CVD-W film/CVD-TiN film/CVD-Ti film/PVD-Co film with which the contact hole C1 is filled. In this case, a $CoSi_X$ film (SIL) is provided at the bottom portion of the plug PSUB.

Also in the present embodiment, since a PVD-metal film (metal film formed by PVD) is used as the first barrier metal film BM1 which is a lowermost layer barrier metal film and configures the plug PSUB, a metal silicide layer SIL can be formed stably at the boundary between the PVD-metal film and the silicon layer (or silicon substrate) lying therebelow. The present embodiment can therefore produce an advantage similar to that of First Embodiment such as stabilization of contact resistance.

In addition, $CoSi_X$ has resistance lower than that of $TiSi_X$ so that the contact resistance can be stabilized further. The PVD-Co film may be replaced by a PVD-Ni film. In this case, the plug PSUB has, at the bottom portion thereof, a $NiSi_X$ (nickel silicide) film.
[Manufacturing Method]
Steps of manufacturing the semiconductor device of the present embodiment are similar to those of First Embodiment (refer to FIGS. 8 to 22) except for the steps of forming plugs PSUB and P1 so that only the steps of forming these plugs will hereinafter be described With respect to the steps of forming the plugs PSUB and P1, the step of forming the PVD-Ti film, of the steps of forming the plug P1 in First Embodiment (refer to FIG. 6), may be used as the step of forming a PVD-Co film. This means that a thin Co film may be formed as the first barrier metal film BM1 in the deep trench DT2 by sputtering, which is a kind of PVD (refer to FIG. 6B).

In the present embodiment, a three-layer film (CVD-TiN film/CVD-Ti film/PVD-Co film) is used as the barrier metal film, but two-layer film (CVD-TiN film/PVD-Co film) may be used as in Second Embodiment.

The invention made by the present inventors has been described above specifically based on some embodiments but the present invention is not limited to or by them. It is needless to say that it can be modified in various ways without departing from the gist of the invention.

Figure 26:
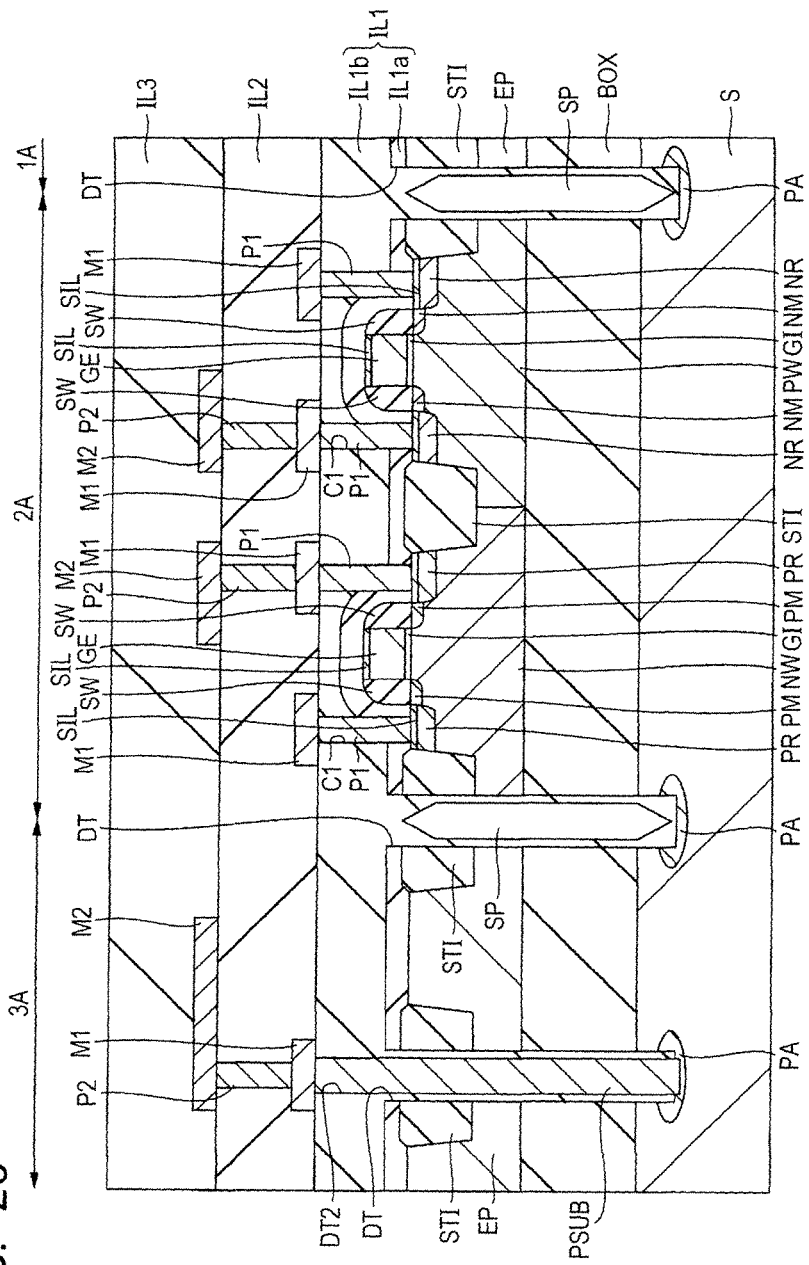
FIG. 26 is a cross-sectional view showing another configuration of the semiconductor device of Third Embodiment.

For example, in the above embodiments, the semiconductor substrate having an epitaxial layer (n type epitaxial film NBL) EP is shown by way of example as a semiconductor substrate but, it may be replaced by a semiconductor substrate (so-called SOI substrate (silicon on insulator wafer)) having a thick insulation layer BOX and an epitaxial layer EP thereon as shown in FIG. 26. FIG. 26 is a cross-sectional view showing another configuration of a semiconductor device of the present embodiment. In particular, the plug (substrate contact) PSUB inevitably becomes deep in an SOI substrate comprised of an insulation layer BOX having a thickness of 2 μm or more so that the contact resistance of the plug (substrate contact) PSUB can be stabilized by using the configuration of the barrier metal film of First to Third Embodiment.

In the above embodiments, a LDMOS transistor has been described by way of example as an element formed in the first element formation region 1A but when the element requires isolation by the n type epitaxial film NBL, another element may be provided. Examples of the another element include bipolar transistor and diode. An element to be formed on the SOI substrate is not limited to a CMOS transistor but another element may be formed.

What is claimed is:
1. A method of manufacturing a semiconductor device, comprising the steps of:
 (a) forming a first element in a first region of a substrate and a second element in a second region of the substrate;
 (b) forming a first trench in a third region of the substrate and in an outer peripheral region of the second region of the substrate;
 (c) forming an interlayer insulating film over the first element and the second element;
 (d) removing the interlayer insulating film over the first trench in the third region and inside the first trench to form a second trench reaching the substrate;
 (e) forming, in an inner region of the second region, a third trench reaching a component of the second element; and
 (f) forming a conductor in the second trench and the third trench,
 wherein the step (f) comprises the following sub-steps of:
 (f1) forming a first conductive film over the bottom surface and side wall of the second and third trenches;
 (f2) forming a second conductive film over the first conductive film;
 (f3) forming a third conductive film over the second conductive film; and
 (f4) forming a fourth conductive film over the third conductive film so as to fill the second and third trenches therewith, and
 wherein the step (f2) is a step of forming the first conductive film having a first metal by physical vapor deposition.
2. The method of manufacturing a semiconductor device according to claim 1, further comprising, after the step (b), a step of:
 implanting an impurity ion into the substrate at the bottom portion of the first trench.
3. The method of manufacturing a semiconductor device according to claim 1,
 wherein in the step (c), the first trench is filled with the interlayer insulating film having a space therein.
4. The method of manufacturing a semiconductor device according to claim 1,
 wherein the second conductive film is a film having the first metal and formed by chemical vapor deposition, wherein the third conductive film is a compound film of the first metal formed by chemical vapor deposition, and wherein the second trench has, at the bottom surface thereof, a compound film between the substrate and the first metal.

5. The method of manufacturing a semiconductor device according to claim 1, wherein the second trench has an aspect ratio of 15 or more, the second trench has a depth of 12 μm or more, and the second trench has a width of 0.8 μm or less.

6. The method of manufacturing a semiconductor device according to claim 1, wherein the second trench has a linear plane shape and the third trench has a substantially round plane shape.

7. The method of manufacturing a semiconductor device according to claim 1, wherein the substrate has a support substrate and an epitaxial layer formed over the support substrate.

* * * * *